US005401973A

United States Patent [19]

McKeown et al.

[11] Patent Number: 5,401,973

[45] Date of Patent: Mar. 28, 1995

[54] INDUSTRIAL MATERIAL PROCESSING ELECTRON LINEAR ACCELERATOR

[75] Inventors: Joseph McKeown, Kanata; Stuart T. Craig, Deep River; Norbert H. Drewell, Kanata; Jean-Pierre Labrie, Kanata; Court B. Lawrence, Kanata; Victor A. Mason, Deep River; James Ungrin, Deep River; Bryan F. White, Deep River, all of Canada

[73] Assignee: Atomic Energy of Canada Limited, Canada

[21] Appl. No.: 986,148

[22] Filed: Dec. 4, 1992

[51] Int. Cl.[6] .............................................. H01J 37/30

[52] U.S. Cl. ................................ 250/492.3; 250/310; 250/396 R

[58] Field of Search .................. 250/310, 311, 396 R, 250/398, 492.2, 492.3, 397, 492.1

[56] References Cited

U.S. PATENT DOCUMENTS

| | | |
|---|---|---|
| H678 | 9/1989 | Baker et al. . |
| 1,044,373 | 11/1912 | Gilchrist . |
| 2,237,878 | 4/1941 | Haeff . |
| 2,600,778 | 6/1952 | Klutke . |
| 2,920,228 | 1/1960 | Ginzton . |
| 2,938,122 | 5/1960 | Cole . |
| 3,033,985 | 5/1962 | Petree . |
| 3,070,726 | 12/1962 | Mallory ............................ 315/5.42 |
| 3,114,077 | 12/1963 | Spindle . |
| 3,193,317 | 7/1965 | Guyant . |
| 3,193,717 | 7/1965 | Nunan . |
| 3,239,664 | 3/1966 | Farrell . |
| 3,277,342 | 10/1966 | Ross . |
| 3,387,216 | 6/1968 | Gagliardi et al. . |
| 3,412,337 | 11/1968 | Lothrop . |
| 3,534,811 | 10/1970 | Walz . |
| 3,590,250 | 6/1971 | Witkover . |
| 3,683,287 | 8/1972 | Miessner . |
| 3,691,377 | 9/1972 | Matsui et al. . |
| 3,738,168 | 6/1973 | Mansell . |
| 3,764,923 | 10/1973 | Woodworth et al. . |
| 3,780,305 | 12/1973 | Free . |

(List continued on next page.)

FOREIGN PATENT DOCUMENTS 494638 7/1953 Canada .

(List continued on next page.)

OTHER PUBLICATIONS

"A Racetrack Microtron RF System", Tallerico et al, IEEE Transactions on Nuclear Science, vol. NS-32, No. 5 Oct. 1985, pp. 2863-2864.

(List continued on next page.)

*Primary Examiner*—Jack I. Berman
*Assistant Examiner*—James Beyer
*Attorney, Agent, or Firm*—Hayes, Soloway, Hennessey, Grossman & Hage

[57] ABSTRACT

An electron linear accelerator for use in industrial material processing, comprises an elongated, resonant, electron accelerator structure defining a linear electron flow path and having an electron injection end and an electron exit end, an electron gun at the injection end for producing and delivering one or more streams of electrons to the electron injection end of the structure during pulses of predetermined length and of predetermined repetition rate, the structure being comprised of a plurality of axially coupled resonant microwave cavities operating in the $\pi/2$ mode and including a graded-$\beta$ capture section at the injection end of the structure for receiving and accelerating electrons in the one or more streams of electrons, a $\beta=1$ section exit section at the end of the structure remote from the capture section for discharging accelerated streams of electrons from the structure and an rf coupling section intermediate the capture section and the exit section for coupling rf energy into the structure, an rf system including an rf source for converting electrical power to rf power and a transmission conduit for delivering rf power to the coupling section of the structure, a scan magnet disposed at the exit end of the structure for receiving the electron beam and scanning the beam over a predetermined product area and a controller for controlling the scanning magnet and synchronously energizing the electron gun and the rf source during the pulses.

10 Claims, 15 Drawing Sheets

U.S. PATENT DOCUMENTS

| | | | |
|---|---|---|---|
| 4,742,480 | 5/1988 | Vaughn et al. . | |
| 4,743,785 | 5/1988 | Milberger et al. . | |
| 4,754,200 | 6/1988 | Plumb et al. . | |
| 4,774,408 | 9/1988 | Gohike . | |
| 4,791,234 | 12/1988 | Faler et al. . | |
| 4,839,561 | 6/1989 | Ito . | |
| 4,839,562 | 6/1989 | Francis et al. . | |
| 4,845,371 | 7/1989 | Stieber . | |
| 4,851,670 | 7/1989 | Krivanek . | |
| 4,866,711 | 9/1989 | Borup et al. . | |
| 4,906,899 | 3/1990 | Hope et al. . | |
| 4,926,052 | 5/1990 | Hatayama et al. . | |
| 3,786,275 | 1/1974 | Quesinberry et al. . | |
| 3,790,794 | 2/1974 | Murray et al. . | |
| 3,825,830 | 7/1974 | O'Connor . | |
| 3,825,839 | 7/1974 | Someya et al. . | |
| 3,831,121 | 8/1974 | Oster . | |
| 3,835,327 | 9/1974 | Lawrence . | |
| 3,867,635 | 2/1975 | Brown et al. . | |
| 3,902,097 | 8/1975 | Offermann . | |
| 3,916,239 | 10/1975 | Friedlander . | |
| 3,953,758 | 4/1976 | Tran . | |
| 4,000,471 | 12/1976 | Pankow . | |
| 4,037,470 | 7/1977 | Mock et al. . | |
| 4,054,811 | 10/1977 | Huber et al. . | |
| 4,063,098 | 12/1977 | Enge . | |
| 4,072,865 | 2/1978 | Craig et al. . | |
| 4,075,488 | 2/1978 | Okayama et al. . | |
| 4,114,985 | 9/1978 | Friedman . | |
| 4,134,017 | 1/1979 | Azam et al. . | |
| 4,191,887 | 5/1980 | Brown . | |
| 4,200,844 | 4/1980 | Nunan . | |
| 4,233,519 | 11/1989 | Coad . | |
| 4,243,888 | 1/1981 | Gruhn et al. . | |
| 4,243,916 | 1/1981 | Leboutet et al. . | |
| 4,247,801 | 1/1981 | Dallos et al. | 315/107 |
| 4,253,048 | 2/1981 | Osako . | |
| 4,312,225 | 1/1982 | Williams . | |
| 4,321,824 | 3/1982 | Martin . | |
| 4,323,853 | 4/1982 | Kurokawa . | |
| 4,324,980 | 4/1982 | Symmons . | |
| 4,333,036 | 6/1982 | Farrell . | |
| 4,358,683 | 11/1982 | Seifert . | |
| 4,361,812 | 11/1982 | Farrell et al. . | |
| 4,436,437 | 3/1984 | Beggs et al. . | |
| 4,450,357 | 5/1984 | Tsuno . | |
| 4,455,489 | 6/1984 | Brown . | |
| 4,455,532 | 6/1984 | Gregory et al. . | |
| 4,511,799 | 4/1985 | Bjorkholm . | |
| 4,555,666 | 11/1985 | Martin . | |
| 4,570,109 | 2/1986 | Nicolai et al. . | |
| 4,596,687 | 6/1986 | Dagenhart . | |
| 4,598,203 | 7/1986 | Umetani et al. . | |
| 4,618,266 | 10/1986 | Feller . | |
| 4,620,078 | 10/1986 | Smith . | |
| 4,634,925 | 1/1987 | Ieki | 313/454 |
| 4,641,103 | 2/1987 | Madey et al. . | |
| 4,651,001 | 3/1987 | Harada et al. . | |
| 4,677,325 | 6/1987 | Einzinger et al. . | |
| 4,684,782 | 8/1987 | Murakami et al. . | |
| 4,700,108 | 10/1987 | Morse . | |
| 4,701,925 | 10/1987 | Fuke et al. . | |
| 4,703,471 | 10/1987 | Fitelson et al. . | |
| 4,733,132 | 3/1988 | Miyata et al. . | |
| 4,736,106 | 4/1988 | Kashy et al. . | |

FOREIGN PATENT DOCUMENTS

| | | | |
|---|---|---|---|
| 610549 | 12/1960 | Canada . | |
| 663293 | 5/1963 | Canada . | |
| 670549 | 9/1963 | Canada . | |
| 1027677 | 3/1978 | Canada . | |
| 1044373 | 12/1978 | Canada | 353/14 |
| 1044374 | 12/1978 | Canada | 353/14 |
| 1045717 | 1/1979 | Canada . | |
| 1083258 | 8/1980 | Canada . | |
| 1088206 | 10/1980 | Canada . | |
| 1096970 | 3/1981 | Canada . | |
| 1165440 | 4/1984 | Canada . | |
| 1214874 | 12/1986 | Canada . | |

OTHER PUBLICATIONS

"Status of PLS 2-GeV Linear Accelerator", Namkung et al. pp. 501-503, 3rd European Particle Accelerator Conference, Mar. 1992, vol. 1 Berlin.

"Tests with an Isochronous Recirculation System", IEEE Transaction on Nuclear Science, vol. NS-32, No. 5/2 Oct. 1985, New York, Flanz et al, pp. 3213-3215.

"Injector for Lisa", 1988 Linear Accelerator Conf. Proc. pp. 400-402, Aragona et al., Oct.

"Power-Supply System for High—Voltage Electron Guns with Grid Control", All-Union Electrotechnical Institute, Moscow. Translated from Pribory i Tekhnika Eksperimenta No. 6, pp. 127-129, Nov.-Dec. 1984, Yu. V. Grigor'ev.

The Impela Control System: C. B. Lawrence, S. T. Craig, J-P. Labrie, S. Lord and B. F. White.

Impela: An Industrial Accelerator Family: J. Ungrin, (List continued on next page.)

OTHER PUBLICATIONS

N. H. Drewell, N. A. Ebrahim, J–P. Labrie, C. B. Lawrence, V. A. Mason, and B. F. White.

Technology Review of Accelerator Facilities: Joseph McKeown.

Dose Quality Assurance for Industrial Irradiation with an Electron Linac: B. F. White, C. B. Lawrence, G. E. Lee—Whiting, S. Lord, V. A. Mason, D. L. Smyth and J. Ungrin; pp. 1169–1172.

AECL Impela Electron Beam Industrial Irradiators: J—P. Labrie, N. H. Drewell, N. A. Ebrahim, C. B. Lawrence, V. A. Mason, J. Ungrin and B. F. White; pp. 1153–1157.

RF System for High—Power Industrial Irradiators: J—P. Labrie, S. T. Craig, N. H. Drewell, J. Ungrin and B. F. White.

Recent Developments in High Energy Electron Beam Technology in Canada: J. McKeown and S. L. Iverson; Invited paper presented at the 19th Japan Conference on Radiation and Radioisotopes, Sankei Kalkan, Tokyo, 1989 Nov. 14–16.

Beam Delivery Systems for Industrial Accelerators: V. A. Mason and R. W. Davis.

Energy Control of the Impela Series of Industrial Accelerators: G. Hare, S. Craig, J—P. Labrie, C. B. Lawrence, J. Ungrin, and B. White; pp. 470–473.

A High—Power RF Efficient L-Band Linac Structure: J—P. Labrie, S. B. Alexander and R. J. Kelly.

Impela Electron Accelerators for Industrial Radiation Processing; Gerald E. Hare.

Controlled Magnet Excitation for Electron Beam Scanning in Industrial Irradiators; B. F. White, S. T. Craig, V. A. Mason, S. M. Morsink and D. L. Smith.

Operating Experience with the Impela–10/50 Industrial Linac; J. Ungrin, S. B. Alexander, S. T. Craig, G. Frketich, V. A. Mason, I. L. McIntyre, M. P. Simpson, D. L. Smyth, R. J. West, and B. F. White.

Electron Linear Accelerator Structures for Pure and Applied Research: J. McKeown.

A High—Duty—Cycle Long—Pulse Electron Gun for Electron Accelerators; N. A. Ebrahim and M. H. Thrasher.

International Symposium on High Dose Dosimetry for Radiation Processing; Vienna, Austria, 5–9 Nov. 1990—Experience with E–Beam Process Dosimetry at the Whiteshell Irradiator: Kishor Mehta, John Barnard, Wayne Stanley and Abe Unger.

The I—10/1 (10 MeV, 1 kW) Electron Liner Accelerator for Irradiation Research and Pilot Scale Operations. G. E. Hare.

Electron Dosimetry for 10 MeV Linac. K. K. Mehta, G. VanDyk.

An Intense Radiation Source. J. McKeown, J—P. Labrie, L. W. Funk.

Radiation Processing Using Electron Linacs. J. McKeown.

A New Generation of Intense Radiation Sources. J. McKeown.

New Accelerator for Radiation Processing; CW—type Linac. J. McKeown.

Electron Accelerators—A New Approach. J. McKeown.

The Coaxial Coupled—Linac Structure. J—P. Labrie and J. McKeown.

A Compact Doubly Achromatic Asymmetric Two—magnet Beam Deflection System. R. M. Hutcheon, E. A. Heighway.

High Power, On—axis Coupled Linac Structure. J. McKeown, R. T. F. Bird, K. C. D. Chan, S. H. Kidner, J—P. Labrie.

Effective Shunt Impedance Comparison Between S—band Standing Wave Accelerators with On—axis and Off—axis Couplers. S. O. Schriber, L. W. Funk, R. M. Hutcheon.

Mechanical Design Considerations of a Standing Wave S—band Accelerator with On—axis Couplers. S. B. Hodge, L. W. Funk and S. O. Schriber.

INDUSTRIAL MATERIAL PROCESSING ELECTRON LINEAR ACCELERATOR

The present invention relates to linear accelerators in general and, more specifically, to electron linear accelerators for use in industrial material processing.

BACKGROUND OF THE INVENTION

The underlying science for the chemical and biological changes resulting from exposure to electron and photon beams is well understood. A significant world business which treats several billions of dollars of product annually, has ben created by the exploitation of radiation technology. In general, electron accelerators are used to process biologically inert materials to improve the physical characteristics of materials while intense radiation sources emitting higher penetration photons are used to sterilize materials used in medicine. This differentiation of application is directly attributable to the lower penetration of electrons and the high dose required by most chemical processes.

Accelerators in current use for processing materials operate in a direct current mode. They consist of two main classifications designated "electron curtain" machines where the energy is restricted to less than 500 keV and "high voltage" machine where the maximum energy is 5 MeV.

Recently, industrial linear accelerators have ben developed which are able to accelerate electrons to 10 MeV with power levels up to 20 kW. They offer the prospect of allowing electron accelerators to enter me lucrative medical sterilization market. A feature of the higher energy is the ability to convert the electron energy to photons with an efficiency which is more than twice that possible with 5 MeV electrons. This property of the electron nuclear interactions is further enhanced by kinematic considerations which demand that the photon beam be projected more in the forward direction. This means that for a given beam power the photon flux on-axis is seven times more intense at 10 MeV than at 5 MeV.

All dc accelerators stand off the high voltage across an insulated accelerating tube which contains the accelerating electrodes. Electrons entering the tube are accelerated to the final energy determined by the terminal voltage. The weakness of this system Is that under intense radiation, electric charges will be created on the insulating tube and breakdown can occur. This breakdown will also occur under the electrical stress of the field itself. This is a direct consequence of the fundamental principle that the final electron energy, as defined in electron volts, is set by the actual voltage which the insulator must withstand. In practice, for industrial accelerators the energy limit imposed by this limitation is 5 MeV. In pushing these limits, manufacturers are tempted to compromise reliability.

The linear accelerator (linac) does not suffer from this limitation. It consists of a copper tube with a series of specifically shaped discs or cavities along its length. The oscillating electric field is contained within this copper tube, which is held at ground potential. Depending on the frequency of oscillation and the gradient, the actual potential difference between any two points in the system does not exceed 500 keV. An insulator is not required to sustain the high electric fields associated with this voltage. Existing industrial linacs work under a high level of stress which is undesirable to an industrial machine. This is a direct consequence of their historical pedigree rooted in particle physics research where emphasis is on high energy, high peak power, high field gradient and high klystron voltage with lesser consideration to high average power. The present invention addresses all of these limitations.

The present invention provides a new type of industrial linear accelerator that is conservatively inside the performance limits of accelerator technology. Energy gradients of research and medical linacs are typically 10 MeV/m. The gradient of the present invention is 3 MeV/m. Average power gradients have been tested in operational electron linacs of 100 kW/m. The present invention provide gradients of 15 kW/m. Beam currents during the pulse are of the order of 1 A in existing pulsed linacs while the present invention produces a beam current of about 100 mA during the pulse.

These conservative ratings are made possible by using an L-band single accelerator structure with a Wehnelt controlled electron gun, a graded-$\beta$ capture section directly coupled to $\beta=1$ section and by driving the assembly with a low-peak power, modulated-anode klystron operated in a long pulsed mode. The long pulse has several advantages including the requirement for very modest peak power (2.5 MW), consequent low voltages on the klystron (<100 kV) and a modulated anode which provides the pulse structure without having to transfer the power as in a conventional line modulator. The modest beam current means that beam-cavity interactions, which commonly consume power by exciting beam break up Cobu) modes, are rendered impotent. These basic physics principles have been embodied into an engineered prototype which has operated at 10 MeV and 50 kW with an availability of over 97% for over 1500 hours of full power operation.

A very important aspect of the long pulse concept is the ability to use the length of pulse as a variable and hence vary the average power of the beam without changing the physics of the process. The field gradient, the peak power and the current all remain the same. To vary the power of the machine at a constant energy, only the pulse length need be adjusted.

The novel future associated with the long pulse is the ability to control the energy of the accelerated electrons during the pulse. The energy gained by the electrons traversing the structure is the line integral of the electric field. The amplitude of the electric field is controlled using a magnetic field probe to extract some of the power of the cavity, using a crystal detector to measure the amplitude and, after comparing with a voltage setpoint, sending a signal to the rf drive of the klystron to adjust the klystron output. The setpoint thus becomes the accelerator energy setpoint that can be directly linked to an international standard. A major advantage of this method of energy control is the elimination of the need of a magnetic bend to determine the energy and to assure that the possibility of unwanted excursions is eliminated.

Existing industrial rf linear accelerators operate with short pulses whereby rf energy is transmitted to the accelerator in an open loop mode. In this mode, changes in beam current result in a change in the rf field level in the accelerator and hence in a change in energy. This is particularly true of accelerators that dominate the existing industrial rf linac market. In these accelerators, the power and energy are closely tied together and, as the power is increased, the energy must drop. This is a problem for many applications where a variation in the flow of product and, hence, the beam power is necessary but where the energy must remain fixed within tight limits.

Tight energy tolerances can be achieved with expensive power supplies requiring very high stability. These systems use a time average of many pulses to determine a setpoint on the power supply for the energy. They are susceptible to changes in the pulse repetition rate. It is not possible to change the energy during the period of a single pulse with existing technology in the industrial linac field. Alternatively, the beam may be deflected by a calibrated amount in a magnetic field. This provides good energy selection following acceleration of the beam. However, existing systems do not allow the energy to be tightly controlled against the voltage droop that inevitably occurs during a pulse nor do they allow an independent control of the energy and power of the accelerator.

The present invention overcomes these difficulties by operating the accelerator in a long pulse mode with a fast, active feedback loop that can control the rf field during the accelerator pulse. The long pulse length, a pulse greater than 50 $\mu$s, can be achieved with a modulated anode klystron. This provides sufficient time to permit regulation of the drive power to the klystron and hence control the beam energy at the energy setpoint. The beam current, and hence the beam power, is controlled by a separate control loop independently of the energy.

The wide range of applications to which electron accelerators have been subjected has led to unique machines designed for specific applications. Each accelerator has its own set of replacement components. The purchase cost of an accelerator and its replacement pans is high because of the non-recurring engineering cost associated with each part and the cost of inventory pans held by a supplier is high.

By way of background, a linear accelerator structure is composed of a series of cavities in which microwave power is used to establish electromagnetic fields. The cavities are designed to concentrate the electric fields in a beam aperture region of the cavities to accelerate charged particles. The accelerating energy gradient in the cavities is typically 10 MeV/m. The device has poor reliability for industrial use beyond an energy gradient of 10 MeV/m because electrical breakdown in the cavities disrupts beam acceleration.

The parameters that determine the output beam energy are length of the accelerator structure and the electric field gradient. Beams of high-energy are obtained with several accelerator structures in series. The drawback of having several accelerator structures in series is the need for additional control systems. The phase of the microwave fields in each accelerator structure must be controlled to ensure that particles are maintained in synchronism with the accelerating fields throughout the accelerator. The microwave transmission characteristics of each accelerator structure depend on the dimensions and temperature of the device. These must also be controlled precisely during fabrication and operation to obtain the desired output beam energy. The relative microwave power level in the different accelerator structures must be controlled. The control system is further complicated because of the coupling between the control parameters of the machine: phase, microwave transmission, accelerating field amplitude and accelerated beam current. These contribute to the uniqueness of each linear accelerator and, consequently, to the high purchase cost of an accelerator and its replacement parts.

The present invention seeks to simplify the high-energy linear accelerator by adopting a modular approach to address several applications with the same basic components. This allows the use of a single accelerator structure to achieve beams of high energy and eliminates the need for controlling the phase and microwave transmission characteristics of a multi-structure linear accelerator.

In accordance with this aspect of the present invention, the accelerator structure is composed of three building sections: a beam capture section module, a coupler section module and an acceleration section module. The length and number of these modules, joined together to form a monolith accelerator structure, are chosen to meet the desired beam energy and power for a particular application. A family of high-energy accelerators which can address different applications, using the same building components, can then be made available.

The capture section is designed to accelerate and form beam bunches synchronized with the microwave accelerating fields. The coupler section is a device used to transmit the microwave power into the accelerator structure. The acceleration section is composed of a series of identical cavities in which microwave power is used to accelerate the beam. Accelerator sections are joined together with flanges designed to establish good electrical contact for the flow of microwave current and to provide an ultra-high vacuum seal. This is achieved by compressing a copper gasket between two pairs of stainless steel knife edges. The inner pair of knife edges are used for the electrical contact and the outer pair of knife edges are used for the ultra-high vacuum seal.

The cross-sectional area of the electron beam leaving a high power irradiator must be large to ensure good spot overlap during scanning. This is accomplished with the L-band accelerating system. Also, a uniform dose distribution is required at the product to be irradiated.

The dose distribution is governed by software generated waveforms loaded into an arbitrary function generator. Output from the signal generator controls a bipolar power supply which drives the scanning electromagnet.

The electric field strength within a long-pulse linac must be regulated to within a few percent despite changes in beam loading and significant changes in the rf system gain. This regulation must be maintained on a microsecond time scale during the pulsed application of rf power. Regulation is also maintained from pulse to pulse. Good regulation is required to achieve predictable and reproducible irradiator performance. It is also beneficial in that overall electrical efficiency is improved by maintaining a preset beam energy and avoiding beam spill that results from energy-optics mismatch.

Heretofore, electric field regulation was achieved by using short pulses and time-averaged control. Use of short pulses prevents the rapid drop of rf gain from having an appreciable effect within a pulse. Pulse-to-pulse regulation is not done, rather the field strength is averaged over many pulses and controlled to a setpoint. As indicated, this method does not provide any intrapulse regulation. When longer pulses are present, adaptive waveform-shaping has been used in which the error observed during a pulse is used to correct the input drive signal for the following pulse. This method requires complex digital signal processing circuits.

The present invention proposes a controller which consists of broadband yet simple proportional-integral analog control electronics and a single analog to digital converter (ADC) configured as a zero-droop sample and hold. An integration term is applied after a predetermined delay from the start of each pulse. After another short time-delay, the control signal is sampled and stored in the ADC. At the end of the pulse, the integration term is zeroed. At the start of the next pulse, the control signal is set to the value stored in the ADC and the proportional control term is engaged. The cycle repeats for each pulse. The method provides both fixed intra-pulse regulation and pulse-to-pulse regulation with simple electronics. Storing the control signal for use on the subsequent pulse and the staged deployment of the controller terms, effectively removes the dead-time between pulses, thus attaining the performance of a continuous system with a pulsed system.

The power for a pulsed electrical load is often derived from the electrical energy stored in a capacitor bank. The high discharge pulse current generally causes the voltage on the capacitor to droop significantly during the pulse, thereby changing the operation of the driven load during this time. A klystron is an example of such a driven load and a klystron with a modulating anode is often driven by a circuit which includes a switch, a pull-down resistor and the capacitor bank to store the charge for the current pulse through the klystron. When the switch closes, the klystron conducts current and can be used to amplify rf power. The declining voltage during the pulse affects both the cathode potential and the modulated anode potential in such a manner that the accelerating potential, i.e. the difference between the two, changes during the pulse. This circuit is not adequate if a controlled, predetermined change in the accelerating potential is desired.

It has been proposed to employ a programmable variable-voltage power supply to achieve a controlled accelerating potential. The power supply would be commanded to change its output voltage in a predetermined manner during the pulse. This system has proven to be costly and susceptible to reliability problems due to its complexity and number of active components.

The present invention proposes the provision of a switch tube triggered by a low power switch in order to divert a part of the current that flows through the resistor during the pulse through a grid-leak resistor in the switch tube circuit and from there through a diode to a small capacitor connected to ground. With the current during the pulse flowing through the capacitor, the magnitude of the voltage on the capacitor will decrease, drawing the modulated anode voltage with it. By the proper choice of grid-leak resistor, capacitor and the output impedance of the bias supply, the rate of voltage decrease during the pulse can be set to a predetermined value. Although this implementation involves the use of a switch tube, it will be understood that the same principle can be used with transistors as switching elements.

Control of the temperature of an accelerator gun cathode is required in order to maintain the cathode electron emission at a sufficiently high value and to prevent over-heating from damaging the cathode or shortening its life. Accelerator electron gun cathodes are operated at elevated temperatures (>1000° C.) with heating provided by electrical current in a filament heater circuit. Depending upon the cathode type, the electron emission for a given electric potential distribution increases with increasing temperature. This emission characteristic is nonlinear, approaching saturation at and above the operating temperature. Operation at excessive temperatures shortens the life of the cathode and increases the risk of gun arcing due to deposition of cathode material on insulating surfaces.

Radio-frequency linear accelerators accept injected electrons for forward acceleration and reject a fraction of the injected electrons. For accelerators not having a beam "buncher", the rejected electrons may be returned to the gun with significantly greater energy than they had on injection. This backwards-accelerated beam represents a small power loss to the accelerator and a significant power source to the electron gun. For an axi-symmetric geometry, a fraction of the backwards-accelerated electrons will impact on the gun cathode, deposit their energy and increase its temperature. Depending on the injection voltage and injection optics, this rejected beam may become a significant fraction of the power supplied to the cathode heater, altering the operating conditions.

In addition to the backwards accelerated electron beam, the accelerator will also accelerate ions generated from the background gas present in the accelerator. While the accelerator is not optimized for ion acceleration, some ion bombardment will occur. The gas present in the electron gun is ionized by the injected electron beam and the backwards accelerated beam produces a "column " of ions in front of the cathode. These ions will be accelerated by the cathode potential to impact the cathode and other surfaces at negative potential.

For most applications developed to date, the average backwards accelerated beam power is a small faction of the cathode heater power due to the low duty cycle (low average beam power) of the accelerator. Where mitigating measures are required (electron tubes), hollow cathode constructions have been employed or proposed to reduce the portion of the reverse beam impinging on the cathode. In addition, occluding optics may be employed to reduce the portion of the backwards accelerated beam that impacts the cathode. Moreover, it is possible to reduce the energy of the electrons returning to the cathode by operating the cathode at a greater injection voltage, requiring the electrons to "climb the coulomb barrier " before reaching the cathode.

As the average power of the accelerator is increased, the fraction of the cathode heater power that the power deposited by the backward accelerated beams represents grows to become significant. Adjustment of the injection optics by either mechanical or electromagnetic means reduces the back-heating fraction, but does not eliminate the phenomenon. At some finite average power, the back-heating effects prove limiting to further increases in average beam power without deleterious consequences.

The present invention estimates circuit resistance based on measurements of the gun cathode filament circuit voltage and current. A control loop is used to maintain the resistance at a setpoint value by adjusting the filament power supply current setpoint. This control loop may be implemented either in hardware or as a software control program of the accelerator. The filament circuit resistance serves to stabilize the cathode temperature and hence the electron gun performance under the influence of backward accelerated beam and- /or ion bombardment. This resistance is used as an imperfect monitor of the cathode temperature.

Fast shutdown systems are required for linear accelerators to protect high power subsystems from damage. In particular, the shutdown systems are required to discharge the electrical energy stored in the rf power system in the event of anomalous conditions, to extinguish arcs in the rf power delivery system, preventing damage to the waveguide and components, to extinguish arcs in the linear accelerator, minimizing damage to the interior of the accelerator and protecting the rf power system from reflected power, to prevent anomalous rf drive conditions from damaging expensive components, to prevent deposition of excessive accelerated beam current on sensitive elements of the accelerator beam delivery system, and to disable accelerated beam current in the event of a failure of the beam dispersal subsystem.

The topology of a modern high-power accelerator has the major components distributed as appropriate to the requirements of the facility. In such a facility, the components that contribute to the decision that a fault condition exists may be separated from each other as well as from the logical point of action for the decision. The speed of decision and maximum delay to the protective action required are different depending on the characteristics of the fault condition and the tolerance of the affected components for the resulting stress. In many cases, the speed of detection and action exceeds the capabilities of the process control system by several orders of magnitude: a few microseconds as opposed to tens or hundreds of milliseconds. Hence, fast hard-wired protection systems are required.

Conventional protection practice depends, in part, on the design of the accelerator and the limitations imposed by the component manufacturer. For example, until recently, most control systems have been arranged with each signal carried by individual wires to the control room for monitoring and alarm functions. Modern distributed control system designs permit reducing the number of signal cables that enter the control room, with most data being acquired remotely and telemetered via multiplexed digital communication from clustered points. An alternative practice is to provide a high speed detection function at the point of measurement, relay the decision to the control room where it may be logically conditioned and relay the instructions to the protective action point.

The multiple cables required for the conventional schemes carry cost penalties for the cable and installation, have multiple length signalling delays, and are vulnerable to the electromagnetic interference unless high cost optical-fibre systems are used. For specific types of faults, the associated electrical disturbance may be sufficient to defeat the communication function and to prevent protection. The system may also be vulnerable to spurious trips arising from external sources of electromagnetic interference.

These difficulties are overcome by the present invention by the provision of a single communication cable configured as a fail-safe current loop and used for high speed signalling of many protection decisions to one or more activation devices. The optically-isolated communication in the fail-safe sense is achieved with high speed by using a complementary logic drive to discharge the base capacitance of the primary optical isolator with a second optical isolator. The noise immunity for each decision is selected on the basis of the impact of the related fault condition permitting a unique false-alarm/missed-alarm tradeoff for each condition.

The high speed protection system of the present invention employs several key elements. It includes a current loop that is optically-isolated at each connection and chained through each decision device and action module. The current loop is enabled by the supervisory control system to permit testing and logical control. The current loop is arranged to be fail-safe in that a loss of continuity in the loop cable causes the action device to operate and the head-end control to latch the loop in an open state until it is reset. Decision modules employ the full sensor bandwidth available for detection and provide a selectable sustain criterion for the decision as well as limited provision for logical conditioning based on parameters monitored in other modules. A high quality digital communication cable is used for the current loop with the shield connections arranged for high noise immunity. Fault detection circuits are conditioned on the current loop being closed to ensure that, within the signalling delay, only the first fault to be detected is latched for diagnostic purposes. Each signal used for a protection function is separately measured by the supervisory process controller to validate the signal.

SUMMARY OF THE INVENTION

Thus, one aspect of the present invention provides a linear accelerator for use in industrial material processing, comprises an elongated resonant electron accelerator structure defining a linear electron flow path and having an electron injection end and an electron exit end, an electron gun at the injection end for producing and delivering one or more streams of electrons to the electron injection end of the structure during pulses of predetermined length and of predetermined repetition rate, the structure being comprised of a plurality of axially coupled microwave cavities operating in the $\pi/2$ mode and including a graded-$\beta$ capture section at the injection end of the structure for receiving and accelerating electrons in the one or more streams of electrons, a $\beta=1$ section exit section at the end of the structure remote from the capture section for discharging accelerated streams of electrons from the structure and an rf coupling section intermediate the capture section and the exit section for coupling rf energy into the structure, an rf system including an rf source for converting electrical power to rf power and a transmission conduit for delivering rf power to the coupling section of the structure, a scan magnet disposed at the exit end of the structure for receiving the electron beam and scanning the beam over a predetermined product area and controller for controlling the scanning magnet and synchronously energizing the electron gun and the rf source during the pulses.

Another aspect of the present invention relates to an electron gun for use in an electron accelerator in producing an electron beam, the electron gun comprising an anode plate having a central aperture, a dispenser cathode for emitting electrons and a Wehnelt focusing-electrode assembly for focusing electrons emitted by the cathode through the aperture of the anode plate, a resistive heater associated with the cathode for hating the cathode, means responsive to a control signal for energizing the heater, and control means for generating the control signal pulses at a predetermined repetition rate and for predetermined durations to cause the electron gun to emit electrons during the durations, the control means being responsive to a signal representative of the resistance of the heater to cause the heater energizing means to energize the heater to deliver with only sufficient energy to maintain the resistance: of the heater at a predetermined value.

A further aspect of the present invention relates to a device for measuring the electrical current of the electron beam exiting from a linear accelerator, the device comprising a beam line section for transporting an electron beam and for connection to but electrically insulated from an additional portion of the beam line, an axial gap in the beam line section, a tubular member extending across the gap, a beam current toroid concentrically disposed about the beam line section, an electrical conductor extending axially between the toroid and the beam line section and having opposed ends for producing an electrical signal representative of the current of an electron beam in the beam line section, and a control system connected to the opposed ends of the conductor and responsive to the magnitude of the signal to adjust a means for producing the electron beam so as to maintain the beam current at a predetermined value.

A still further aspect of the present invention relates to feedback control system for maintaining the beam line current from an accelerator structure within predetermined limits, the feedback control system including a pulse generator for generating reference current pulses synchronized and coincident with beam current pulses to be measured and an electrical conductor extending axially between a beam current toroid and the beam line for carrying the references pulses, the reference pulses being of the opposite polarity to that of the beam line current so that the current in a beam line current measuring conductor is the differential between the beam line current and the current of the reference pulses, the control system being operable to output a control signal to the pulse generator tending to reduce the differential to zero.

BRIEF DESCRIPTION OF THE DRAWINGS

The foregoing and other features of the invention will become more apparent from the following description in which reference is made to the appended drawings, wherein.

DESCRIPTION OF PREFERRED EMBODIMENT

Figure 1:
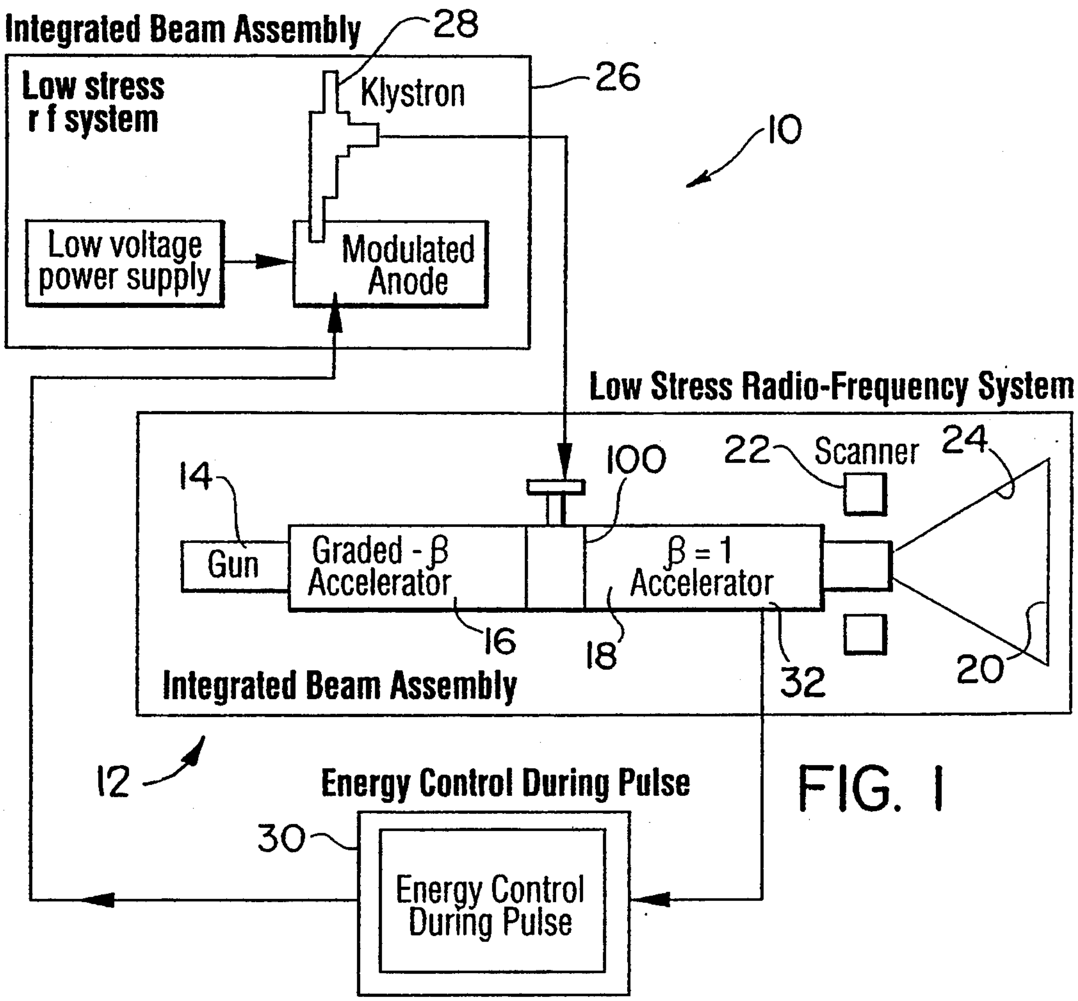
FIG. 1 is a block diagram diagrammatically illustrating the basic systems according to the preferred embodiment of the present invention.
Figure 3:
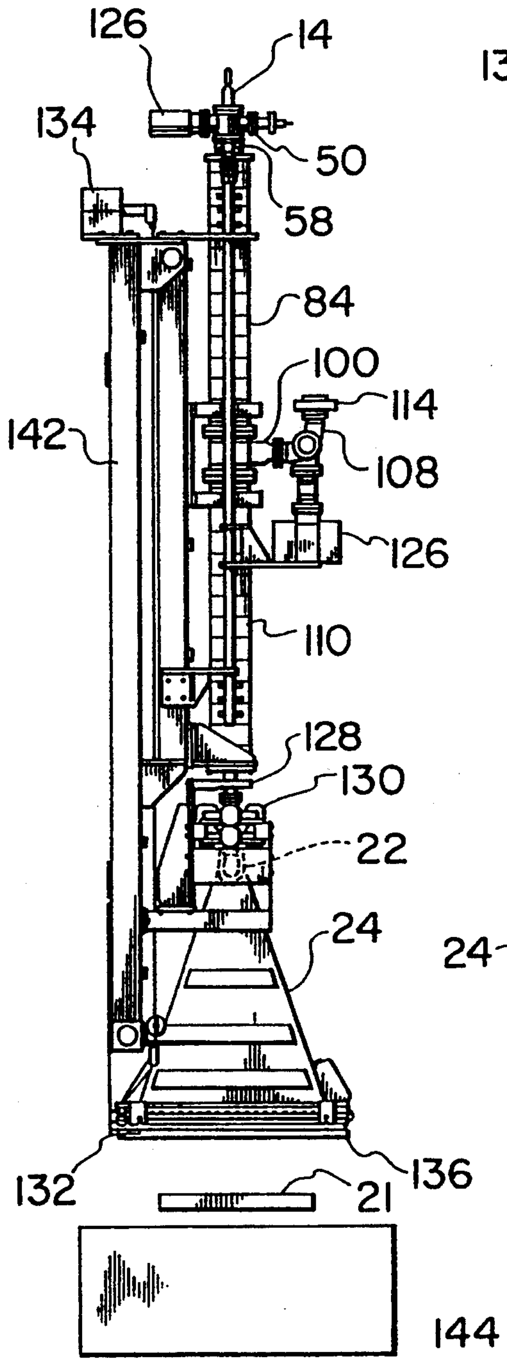
FIG. 3 is a front elevational views of a linear accelerator according to the preferred embodiment of the present invention.

FIG. 1 illustrates the basic operating components of the linear accelerator 10 of a preferred embodiment of the present invention. The accelerator includes an L-band single accelerator structure 12 having, at one end, a Wehnelt controlled electron gun 14 which injects electrons into a graded-$\beta$ capture section 16 which is directly coupled to $\beta=1$ section 18. The accelerator accelerates the electrons to form a beam of predetermined energy. The beam passes out of the accelerator structure and through a scan magnet 22 which sweeps it in a predetermined manner. The beam then passes out through a scan horn 24 through an exit window 20 onto product carried by a conveyor 21 (FIG. 3). A low stress rf system 26 includes a modulated-anode klystron 28 operated in a long pulsed mode (a pulse greater than about 50 μs) generates the electromagnetic field within the accelerator structure to accelerate the electrons with low peak power as explained more fully later.

A novel feature associated with the long pulse is the ability to control the energy of the accelerated electrons during the pulse. This feature provides sufficient time to permit regulation of the drive power to the klystron and hence control the beam energy at the energy setpoint. The beam current, and hence the beam power, is controlled by a separate control loop independently of the energy. The energy gained by the electrons traversing the accelerator structure is the line integral of the electric field. Thus, the amplitude of the electric field is controlled by an energy control system 30 using magnetic field probes 32 to extract some of the power of the cavity, using a crystal detector to measure the amplitude and, after comparing with a voltage setpoint, sending a signal to the rf drive of the klystron to adjust the klystron output. The setpoint thus becomes the accelerator energy setpoint and can be directly linked to an international standard. A major advantage of this method of energy control is the elimination of the need of a magnetic bend to determine the energy and to assure that the possibility of unwanted excursions is eliminated.

The long pulse has several advantages including the requirement for very modest peak power (2.5 MW), consequent low voltages on the klystron (less than 100 kV) and a modulated anode which provides the pulse structure without having to transfer the power as in a conventional line modulator. The modest electron beam current means that beam-cavity interactions, which commonly consume power by exciting beam break up (bbu) modes, are rendered impotent. Another aspect of the long pulse concept is the ability to use the length of pulse as a variable and vary the beam average power without changing the physics of the process. The field gradient, the peak power and the current all remain the same. To vary the average power of the machine at a constant energy, only the pulse length need be adjusted.

One aspect of the present invention seeks to simplify the construction of a high-energy linear accelerator by adopting a modular approach to address several applications with the same basic components. This allows the use of a single accelerator structure to achieve beams of high energy and eliminates the need for controlling the phase and microwave transmission characteristics of a multi-structure linear accelerator. To that end, the accelerator structure is composed of three building sections: a beam capture section module, a coupler section module and an acceleration section module. The length and number of these modules, joined together to form a monolith accelerator structure, are chosen to meet the desired beam energy and power for a particular application. A family of high-energy accelerators which can address different applications, using the same building components, can then be made available.

The capture section is designed to accelerate and form beam bunches synchronized with the microwave accelerating fields. The coupler section is a device used to transmit the microwave power into the accelerator structure. The acceleration section is composed of a series of identical cavities in which microwave power is used to accelerate the beam. The accelerator sections are joined together with flanges designed to establish good electrical contact for the flow of microwave current and to provide an ultra-high vacuum seal. This is achieved by compressing a copper gasket between two pairs of stainless steel knife edges. The inner pair of knife edges are used for the electrical contact and the outer pair of knife edges are used for the ultra-high vacuum seal.

The energy of the electrons delivered by the accelerator is achieved by accelerating electrons with radio frequency (rf) power in a resonant accelerator structure comprised of coupled microwave cavities which resonate in the $\pi/2$ mode. Two types of cavities are used in the structure: accelerating cavities and coupling cavities. The accelerating cavities are specially shaped to impart maximum energy to the electrons passing down the axis and to minimize the loss of rf power in the cavity walls. The coupling cavities are located between the accelerating cavities and couple the rf power between the accelerating cavities. To provide a 50 kW electron beam at an energy of 10 MeV, the accelerator structure is provided with 29 accelerating cavities and 28 coupling cavities. The accelerating and coupling cavities are located on the same axis, i.e. the structure is on-axis coupled. As illustrated in FIG. 1, rf power is introduced into the centre accelerating cavity, i.e. midway between the ends of the structure, and propagates in both directions to the ends of the structure where it reflects to set up standing waves in a $\pi/2$ resonant mode, i.e. the rf field in each cavity is $\pi/2$ radians (90°) out of phase with adjacent cavities. This results in almost a zero rf field in the coupling cavities and maximum rf field in the accelerating cavities. The electric field in the accelerating cavities is concentrated across nose cones (not shown) where it is used to accelerate the electron beam.

In principle, the structure could be supplied with continuous wave (cw) rf power to generate a continuous beam of electrons. However, an accelerator structure operated continuously under the conditions mentioned below would generate 1 MW of electron beam which is much greater than is presently required for commercial irradiation. To retain the efficiency and reduce the beam power, the accelerator is operated at a 5% duty factor. Pulses of electron beam that are sustained for 200 μs are generated at a rate of 250 Hz. The rf power source is pulsed at the same rate to maintain efficiency. The nominal parameters of the preferred embodiment of linear accelerator constructed according to the present invention are:

| | |
|---|---|
| Electron Beam Power | 10 to 50 kW |
| Beam Energy | 10 MeV |
| Duty factor | 5% |
| Pulse Length | 50 to 500 μs |
| Pulse Repetition Frequency | 1 to 500 Hz |
| Peak Beam Current | 100 mA |
| RF Frequency | 1.3 GHz |
| Structure Type | standing wave on-axis coupled |

The rf power system that supplies rf power to the accelerator structure is the largest support system required for operation of the accelerator. Its main components include the high power klystron, the modulator and the high voltage klystron Power Supply (KPS). These are high power devices that must be carefully controlled to provide the required rf power to the accelerator structure and to avoid damage to high power components.

Figure 2:
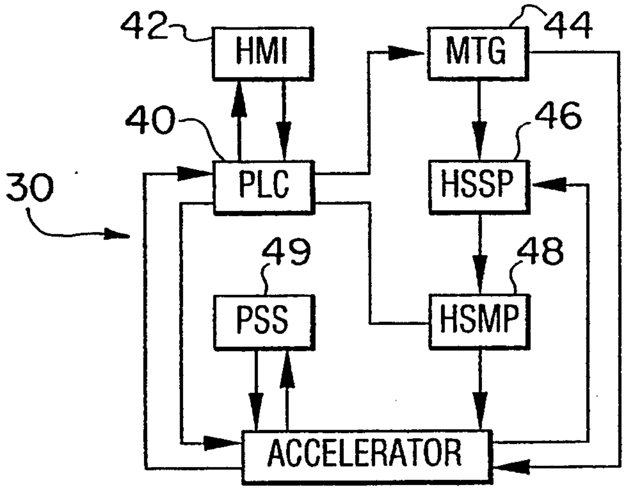
FIG. 2 is a block diagrammatic illustration of the basic components of the control system according to the preferred embodiment of the present invention.

The accelerator is controlled by six systems, generally illustrated in FIG. 2, including a Programmable Logic Controller 40, a Human Machine Interface 42, a Master Timing Generator 44, a High Speed Signal Processing system 46, a High Speed Machine Protection system 48 and a Personnel Safety System 49.

The logic controller provides centralized control of the accelerator. It is able to take actions on analog and discrete variables with response times greater than 500 ms and 100 ms, respectively. Human machine interface 42 is a video display computer connected to the logic controller to provide operator input and readout. Timing generator 44 under the control of the logic controller provides timing pulses which switch rf and high voltage devices and provides sampling pulses for measurement of pulse parameters. Signal processing system 46 consists of dedicated electronic circuits to provide measurements of pulse parameters. The inputs to the signal processing system are the sampling pulses from the timing generator and the pulses to be measured. The output is a voltage that is held constant between pulses and updated during each pulse. High speed machine protection system 48 also consists of dedicated electronic circuits which switch off the rf power or high voltage on a microsecond time scale to prevent damage to the high-power electronic components. The personnel safety system 49 is comprised of relay logic and provides interlocks to protect personnel from hazards. It ensures that areas with radiological, rf radiation or high voltage hazards are secure before the accelerator is started.

The accelerator consists of nine manufactured subsystems and a shielded facility to provide protection from the radiological hazards. A generic shielded facility is first described, next the accelerator, located inside the shielding, and then the support equipment, located outside the shielding and finally the operating console.

Shielded Facility

As already mentioned, the preferred embodiment of the accelerator produces a 50 kW beam of electrons that have an energy of 10 MeV. This beam is lethal and shielding must be provided to protect personnel. Bremsstrahlung X-ray radiation is produced by electron beam spill as it is accelerated through the accelerator, when it passes through the beam window and when it impinges on the product, conveyor, beam stop and other accelerator components. Activation of accelerator components and product is possible but with careful selection of component material and restriction of the product to be irradiated, activation can be controlled to low levels. Most uses of the electron beam require the beam to pass from the accelerator's vacuum envelope, through air, and onto the product. Interaction of the electron beam with air generates ozone ($O_3$) and nitrous oxides which are hazardous.

To provide radiological protection, the accelerator is surrounded by a shield made from normal density concrete. A conveyor 21 usually carries product through the beam but transport of bulk material via a pipe or in continuous form such as cable is also possible. The product to be irradiated is transported through a concrete maze, irradiated by the electron beam, and transported out through a concrete maze. Water cooled beam stop 144, located below conveyor 21, absorbs the beam when product is not present. Ventilation is arranged to provide an air flow from the maze entrance and exit, toward the irradiation area, and then out an exhaust duct. Fresh air is supplied at the maze entrance and exit and also to the area around the accelerator.

Accelerator

Figure 4:
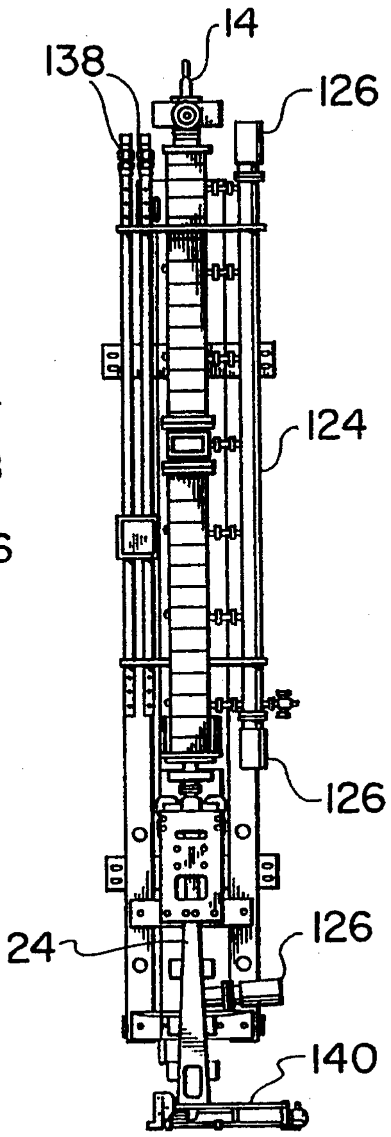
FIG. 4 is a side view of the linear accelerator illustrated in FIG. 3.

The accelerator is illustrated in FIGS. 3 and 4. The electron gun 14, electron gun optics assembly 58, accelerator injection section 84, accelerator coupling section 100, waveguide elbow 108, accelerator exit section 110, microwave window assembly 114, and ion pumps 126 form a vacuum envelope having a base pressure of $10^{-8}$ Torr (about 1 $\mu$Pa). The remaining components are mechanical supports and the electron-beam delivery system.

Figure 5:
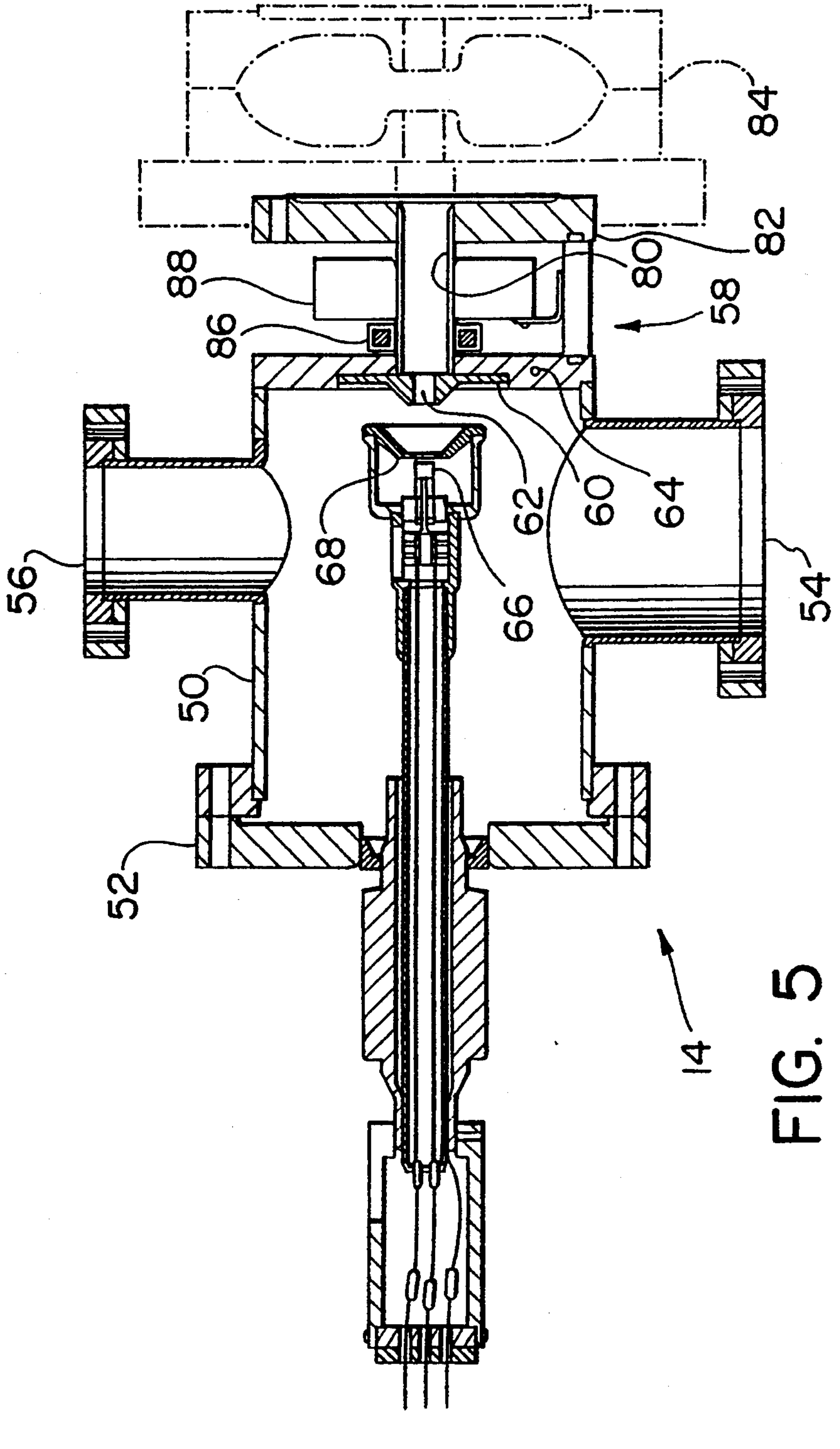
FIG. 5 is a longitudinal cross sectional view through an electron gun.
Figures 6, 7:
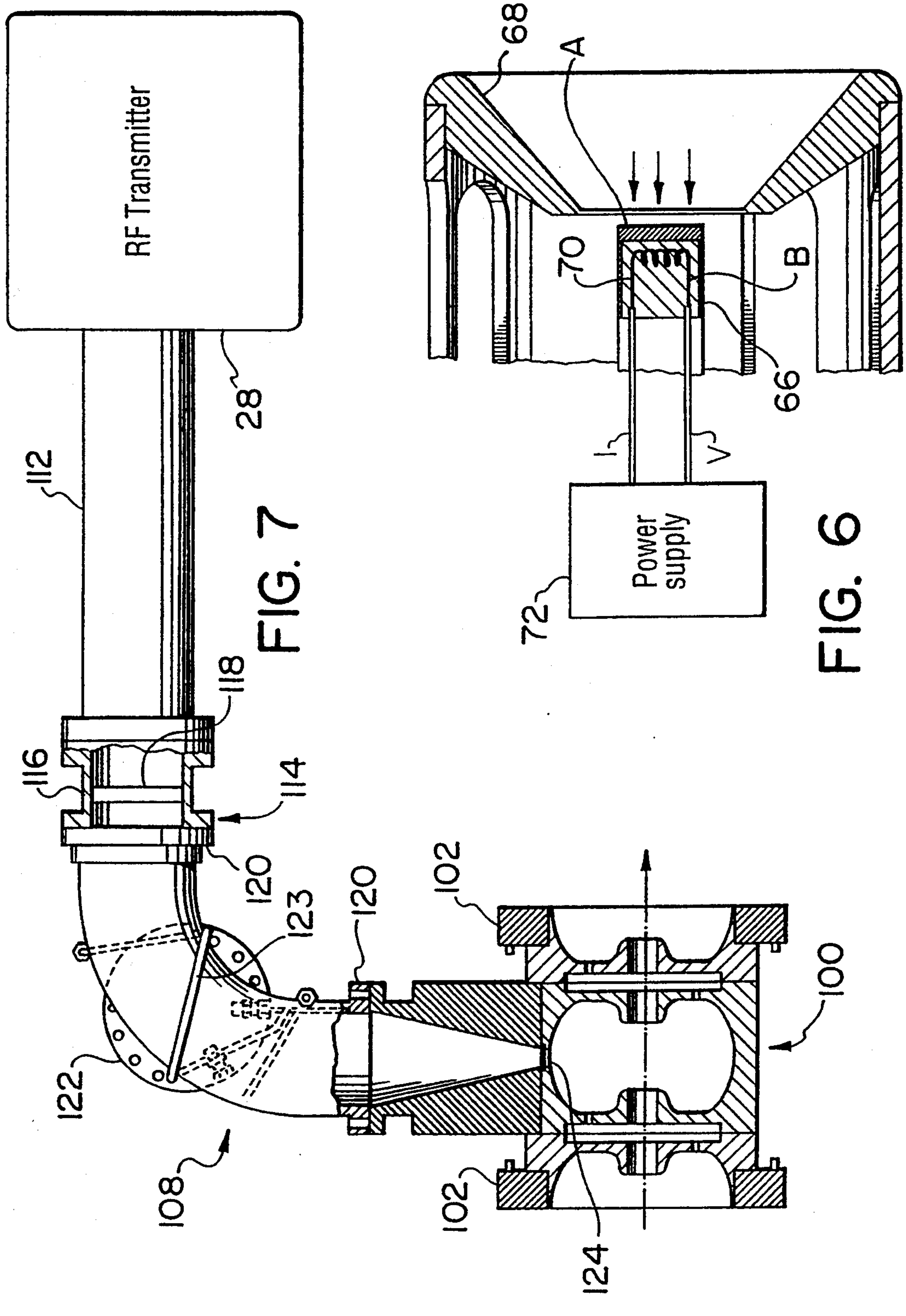
FIG. 6 is an enlarged cross sectional view of the cathode assembly of the electron gun illustrated in FIG. 5.
FIG. 7 is a cross sectional view of the rf coupling section of the accelerator rf elbow and rf window assembly according to the preferred embodiment of the present invention.

With reference to FIGS. 5 and 6, electron gun 14 is mounted in a welded stainless steel housing 50 having Conflat flanges 52 for mounting the gun, and port 54 for connection to a gun ion pump, a port 56 for connection to a getter vacuum pump and for joining the housing to an electron-gun optics assembly 58. An anode plate 60 with a central aperture 62 is mounted just behind a mounting flange 64. Mounting Flange 64 is formed with channels (not shown) through which cooling water flows to control the anode plate temperature. The electron gun includes a dispenser cathode 66 and Wehnelt focusing-electrode assembly 68. Thus, electrons emitted by the cathode 66 are focused into aperture 62 in the anode plate and are injected into the first accelerator cavity. A nominal voltage of −40 kV dc is applied to the cathode. Between accelerator pulses, electron emission from the cathode is cut-off by holding the voltage on the Wehnelt electrode at about −3 kV with respect to the cathode. Controlled electron emission during the accelerator pulse occurs with the voltage on the Wehnelt electrode at about −100 V with respect to the cathode. Adjustment of the Wehnelt voltage by the control system controls the current that is injected into the accelerator. An injection current of about 300 mA peak is required from the gun for full power operation.

In a high-power rf powered accelerator where electrons are injected into the accelerator from an electron gun, which contains a dispenser cathode assembly as described above, throughout the rf cycle, some of the electrons are stopped by the electric field in the first accelerator cavity during the negative portion of the rf cycle and are accelerated backwards towards the cathode with energies in excess of those at which they were injected. Some of these electrons travel on a path near enough to the axis that they pass back through the anode aperture and strike the cathode where they deposit their kinetic energy as heat. In accelerators of this type, the electrons are emitted from the hot cathode surface which is held at a constant temperature of about 1,000° C. The temperature is obtained from and maintained by a resistive heater 70 which is embedded in the cathode assembly. The heater is driven by a power supply 72 typically operating at a current of 2.5 A and a voltage of 8 V. In a low power accelerator, the effects of these electrons are not generally noticed. In a high powered accelerator, where the duty cycle of the accelerator is several percent, the energy deposited in the cathode by these electrons may be sufficiently high to cause overheating of the cathode with subsequent damage, shortened lifetime and large outgassing which can prevent operation of the accelerator.

According to one aspect of the present invention, this problem is overcome by decreasing the power transmitted to the cathode by the power supply to exactly compensate for the power deposited by the back-streaming electrons from the accelerator. The total power into the cathode, i.e. from the resistive heater and the back-streaming electrons, then maintains the constant cathode surface temperature required for long lifetime and good operating characteristics. This is achieved by determining the temperature of the cathode. This method relies on the fact that the electrical resistance of the resistive heater, which is typically 3.5 ohms, is a strong function of the cathode temperature. Hence, if the resistance is maintained at a fixed value, the temperature of the cathode will also be held at a constant value. Both the voltage across the heater and the current are therefore measured accurately during operation and are fed to the programmed logic controller which uses the ratio of these two values to calculate the resistance of the heater. As the accelerator is started up from a cold start to some desired power, a control loop is set up to reduce the current from the power supply to the heater so as to maintain a constant resistance. This then ensures a constant temperature on the cathode surface.

Optics assembly 58 includes a welded stainless steel housing 80 with conflat flanges 64 and 82 at its ends. Flange 64 is secured to the electron gun housing and flange 82 is secured to accelerator injection section 84. Two steering coils 86 and a gap-lens focus-magnet 88 on the assembly steer and focus the electron beam from the electron gun. As already mentioned, cooling water flows through channels in front flange 64. The steering and focusing coils operate at low voltage from power supplies located in rf and accelerator cabinets, respectively, described later.

With reference to FIG. 3, an accelerator injection section 84 includes 13 full and one half accelerating cavities. They are made from oxygen free high conductivity (OFHC) copper segments that are brazed together. Stainless steel flanges are also brazed at the two ends of the section. One half of each cavity segment is an accelerating cavity and the other half is a coupling cavity so that, when brazed together, the segments form alternating accelerating and coupling cavities. Before brazing, each cavity is tuned to provide a structure in which all of the cavities resonate at the same frequency. The first four cavities vary in length to accommodate the change in electron velocity during acceleration and to maintain synchronism between the electrons and the rf electric field. The balance of the cavities have the same length because relativistic velocity has been achieved after the first four cells and further energy is achieved mainly by increasing the mass of the electrons. Cooling channels (not shown) for carrying deionized water are formed as an integral part of the copper segments. Connections from the cooling channels to cooling headers 138 are provided on the stainless steel flanges. Connections to the vacuum manifold are provided by three stainless steel vacuum ports (not shown) with conflat flanges. Two rf field probes 32 (see FIG. 1) are provided for sampling the rf field in the injection section.

With reference to FIGS. 3 and 7, accelerator coupling section 100 comprises two half accelerating cavities 102 and one full accelerating cavity 104 made from OFHC copper with a stainless steel flange on either end. An iris and a tapered waveguide, described below, provide rf coupling to a waveguide elbow 108. The coupling section also includes integral cooling channels, a vacuum port (not shown) and an rf field probe (not shown).

An accelerator exit section 110 comprises 13 full and one half accelerating cavities. The construction of the exit section is identical to the injection section except that all cavities are of the same length. The exit section includes three vacuum ports (not shown) and three rf field probes (not shown) are provided.

A welded stainless steel scan horn 24 is connected to the accelerator exit structure via a stainless steel bellows (not shown). The electron beam is scanned in the scan horn by the scan magnet 22. Flanges at the wide end of the horn hold a thin, 0.13 mm (0.005 inch), titanium exit window 20 (FIG. 1) that permits the electron beam to pass from vacuum to atmosphere. Tubes (not shown) on the outside of the horn and channels in the flange carry water to provide cooling.

High power accelerators require rf power from an rf transmitter, klystron 28 in this case, to be fed to the vacuum cavity in the accelerator so as to, in turn, generate the electric fields that accelerate the electron beam. The power is fed via a rectangular waveguide 112 (see FIG. 10). To prevent voltage breakdown in the waveguide, the waveguide is normally filled with a pressurized insulating gas, such as sulphur hexafluoride. A microwave window assembly 114 is used to keep this gas from entering the accelerator while permitting the transfer of rf power. The assembly consists of a metal flange 116 and an aluminum oxide ceramic disc 118, normally circular, brazed to the flange. During high power operation, it has been found that scattered electrons and low-energy x-rays from the electron beam allow high electric fields to be generated within the ceramic material. These fields become sufficiently large that, after some time, the ceramic will electrically discharge. The discharge leads to damage within the window that destroys its ability to act as a barrier between the vacuum of the accelerator and the pressurized gas in the waveguide.

Figure 10:
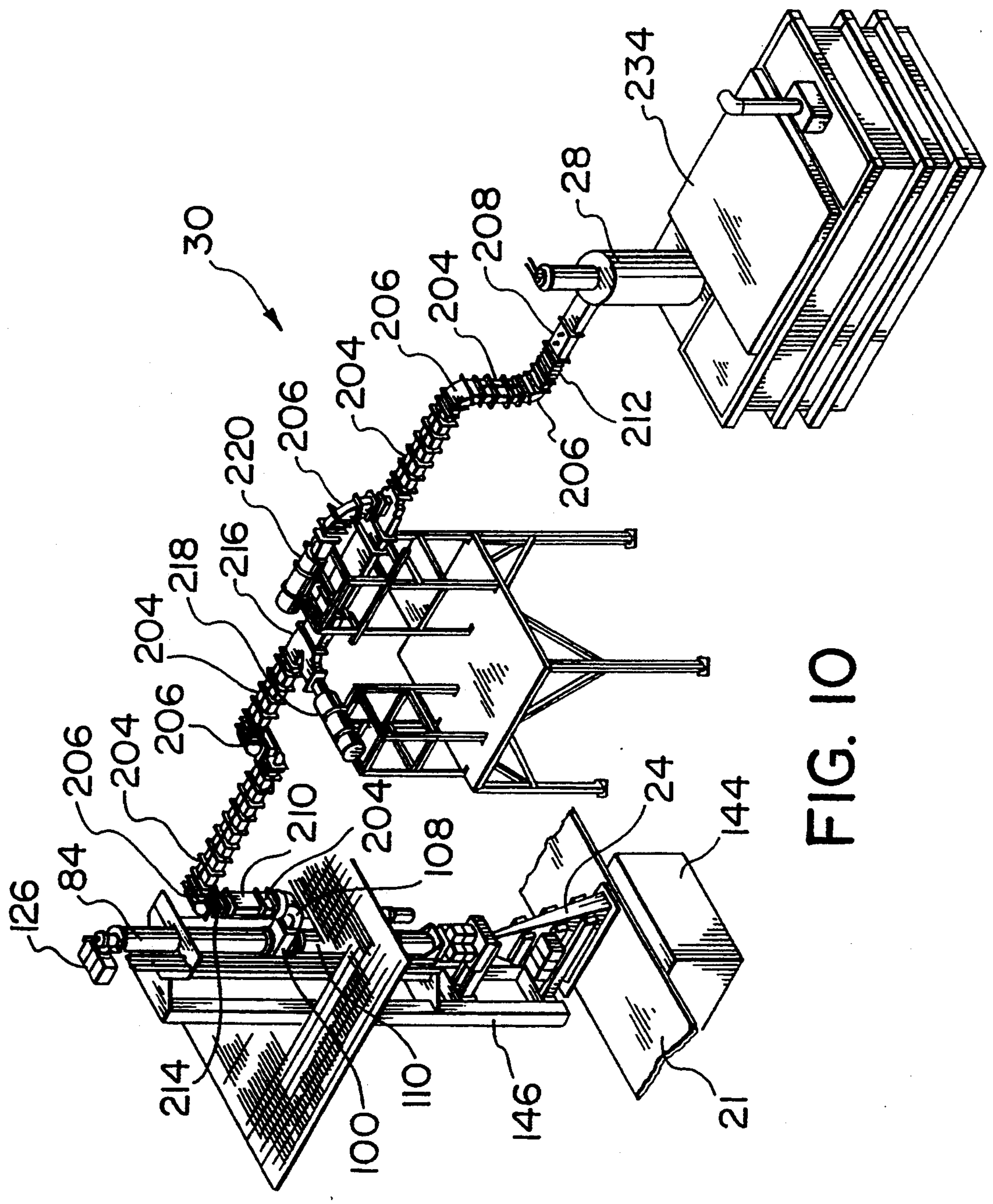
FIG. 10 is a perspective view of the industrial material processing linear accelerator of the present invention illustrating the high power rf transmission system connected to a vertically oriented accelerator section disposed over a product conveyor.

To overcome this problem, the window assembly is placed at a location where electrons and x-rays cannot travel by line-of-sight to the window assembly. To achieve this, there is provided the thick-walled, vacuum waveguide elbow 108. It is connected between the coupling section of the accelerator and the gas filled conventional waveguide. The window assembly is placed between the end of the elbow remote from the coupling section and the pressurized waveguide as shown in FIG. 10. Thus, this arrangement prevents charging of the window by scattered electrons by eliminating a line-of-sight path and by low energy x-rays by introducing the shielding provided by both the accelerator walls and the waveguide walls. The elbow is formed of brazed OFHC copper with stainless steel flanges 120 and a vacuum port 122. Tubes 123 on the outside walls around the vacuum port carry water to provide cooling.

Figure 8:
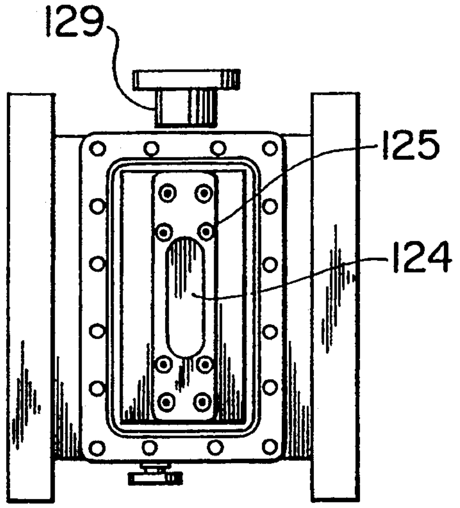
FIG. 8 is a top view of the coupling assembly of FIG. 7.
Figure 9:
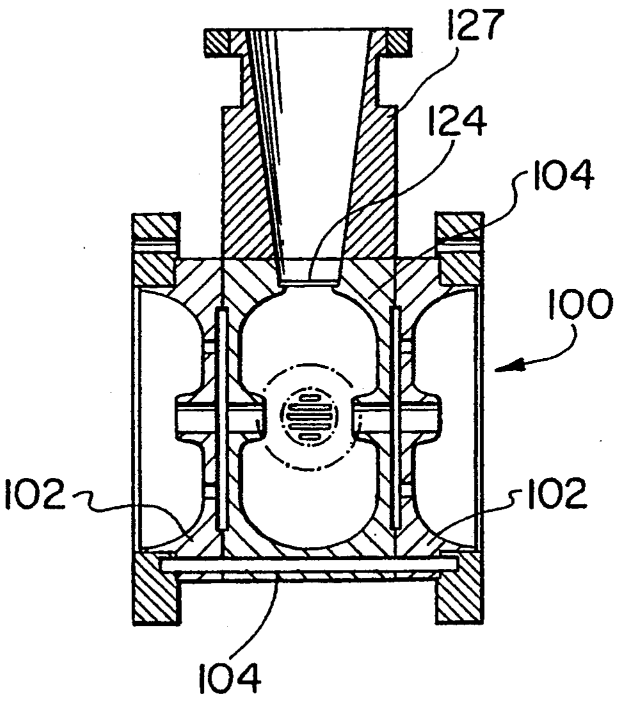
FIG. 9 is a cross sectional view taken along lines 9—9 of FIG. 8.

The rf coupler cavity is the transition between the waveguide transmission system and the accelerator structure. Microwave power from the source is transmitted through the waveguide system and enters the structure through an iris aperture plate 124 (see FIGS. 7 and 8). The iris aperture plate must be in good electrical contact with the rf coupler cavity. This is achieved by provided silver plated vented screws 125. The vacuum in the accelerator must be in the order of $10^{-8}$ torr. The screws that hold the iris aperture plate are vented to eliminate virtual leaks by drilling a hole along their axes. Good electrical contact between the plate and the rf coupler cavity is obtained by silver plating the screws.

A welded stainless steel vacuum manifold 125 having ranged ports 127 (not shown) connects to the accelerator structure via stainless steel bellows (not shown).

Flanges also provide connections to 60 L/s ion pumps 126 attached to the electron gun housing, vacuum manifold, waveguide elbow and scan horn. Power at 5 kV dc is provided via cables from ion pump controllers (not shown) located in the accelerator cabinet outside the shielding. The vacuum connections are either directly to a flange or via a stainless steel bellows.

A Current Toroid 118 is provided to measure the electron beam current from the accelerator. As is well known, the beam is Wansported in a beam line that is a part of the accelerator vacuum system. This beam line is normally constructed of metallic pipe, typically stainless steel. Traditional methods of measuring beam currents involve the use of a toroid which is, in effect, the secondary winding of a transformer. The beam acts as the primary winding. For a transformer to operate, the magnetic field generated by the primary winding must be coupled into the secondary winding. For pulsed beams, the metallic beam pipe shorts out the magnetic paths both by eddy-current effects and by image currents. Therefore, the toroid must be installed either inside the vacuum pipe or outside the beam line over a section of non-metallic pipe. A ceramic section of beam line made typically of alumina is traditionally used. For high power electron accelerators, the toroid will rapidly degrade because of radiation effects if it is mounted in the vacuum system near the beam and, therefore, only the exterior mounted technique is acceptable. Practical experience has shown, however, that at high power operation there is sufficient electric charging if the ceramic by the effects of low energy x-rays generated by the beam that electrical discharges occur within the ceramic and from the ceramic to electrically grounded components. These discharges are sufficiently severe that they result in mechanical damage to the ceramic with a subsequent loss of vacuum integrity and shutdown of the irradiator.

Figure 25:
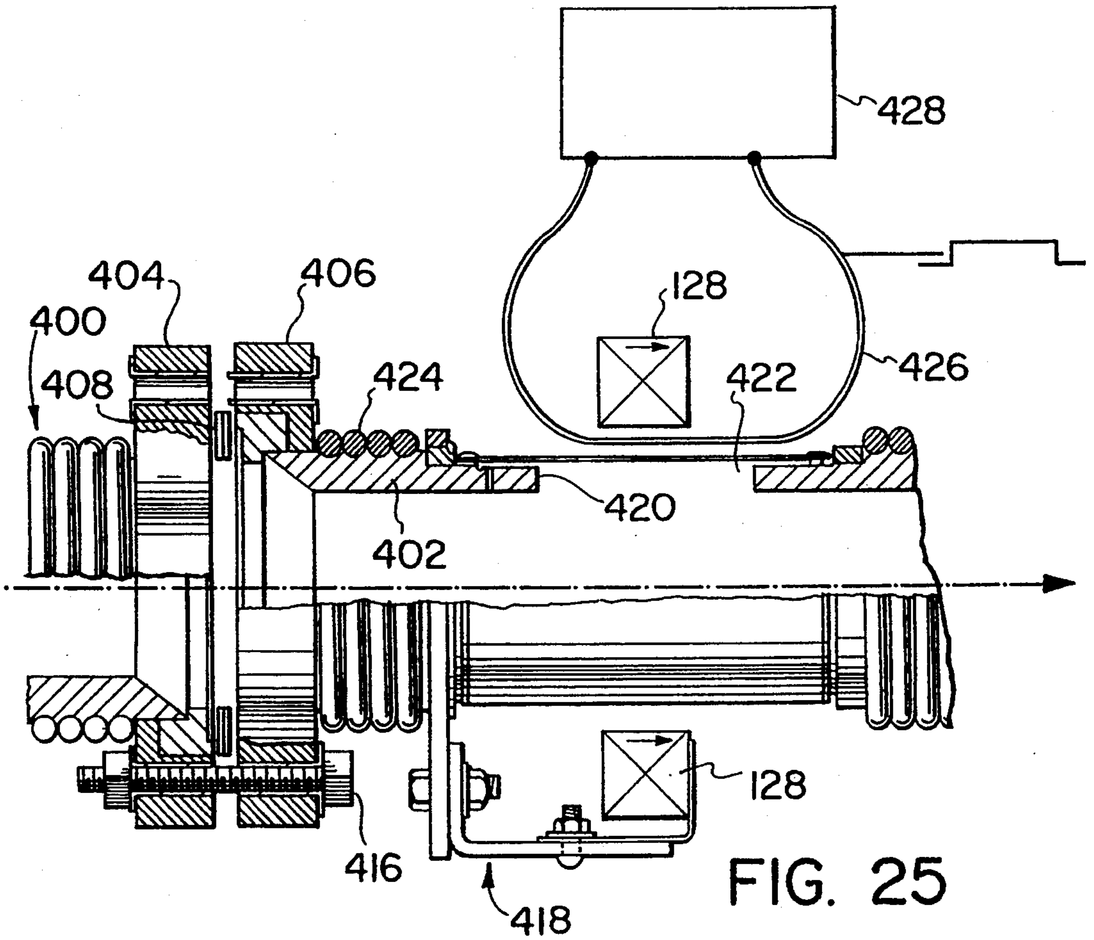
FIG. 25 is a partially broken, cross sectional view of a portion of the beam line about which a beam current toroid is positioned according to the preferred embodiment of the present invention.
Figure 26:
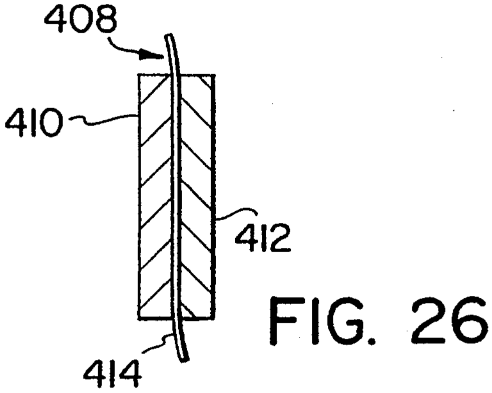
FIG. 26 is a cross sectional view of an electrically insulating gasket disposed two Conflat flanges in the beamline according to the preferred embodiment of the present invention.

The present invention provides a toroid mounting arrangement which provides sufficient electrical isolation in the beam line with a radiation resistant material to prevent the image currents from completely cancelling the magnetic fields generated by the beam current. This is achieved by providing a simple electrically insulating vacuum line seal as shown in FIG. 25. Beam Line 400 extends from the accelerator structure to the scan horn. The portion 402 of the beam line about which the toroid is mounted is separated from the main portion of the beam line and connected thereto by two standard metallic knife edge vacuum (Conflat) flanges 404 and 406 and a special gasket 408. Standard Conflat vacuum seals use a thin annealed copper ring between the two flanges. In the present invention, the copper ring is replaced by gasket 408 which is comprised of two gasket elements 410 and 412 (see FIG. 26) separated by a thin sheet of radiation-resistant polyimide film 414, joined to the two gasket elements by a thin layer of heat-cured glue. The two flanges are bolted together using electrically insulating bolts 416 which can be made of any radiation resistant material or, alternatively, can be standard bolts isolated with a layer of insulating material. The beam toroid is then concentrically mounted on the outside of the beam line near the electrically isolated flange by a suitable mounting assembly 418 secured to the beam line. An axial gap 420 is formed in the beam line and a stainless steel tube 422 extends across the gap and is concentrically mounted onto and secured to the ends of the beam line, as shown. Helical cooling pipes 424 are mounted in intimate contact onto the beam line and returned through the toroid to avoid shorting the current signal. Care is taken to prevent any other paths for image currents. Calibration of the monitor is achieved by passing an electrical conductor 426 through the beam toroid as shown and connecting this conductor to a standard calibrated pulsed current source 428 that generates the beam pulses. This provides for continued calibration throughout the operation of the irradiator should long term irradiation effects degrade either the materials in the toroid or decrease the effectiveness of the electrical insulation in the beam line break.

During normal operation of the machine, the control system uses a measurement of the beam current as part of a feedback loop that holds this measured quantity at the required value during irradiation of the product. It is important, therefore, that the accuracy of the of this measurement be maintained with reasonable confidence over the extended time periods between machine recalibrations. The measurement is done conveniently with the toroid described above so that the beam current travels through the hole of the toroid on its way from the accelerating structure to the product. The signal from the toroid is brought out of the accelerator vault to the processing electronics via radiation resistant cable 426. The toroid and its signal cable used as a transducer or sensor in this way is characterized by a sensitivity which relates the signal magnitude and polarity of the magnitude and polarity of the beam current. The sensitivity depends on a host of factors related to the construction of both the toroid and the signal cable, such as their size and geometry, and the many properties of the materials of their construction. Over time, the sensitivity of a toroid/signal cable system will change as these factors change. The most obvious influences in the present application are the high radiation fields and the ambient ozone atmosphere. Thus, the accuracy of the measurement cannot be assured over extended periods of time.

In order to solve this problem, the present invention converts the measurement of the beam current into a differential or difference measurement in which the differential is deliberately kept small with respect to the current to be determined. The measurement becomes a differential measurement when the current pulse (the reference current) of opposite polarity to that which is being measured is injected through the hole of the toroid. The timing and magnitude of the reference current is set so that the differential current is much smaller than either of the two contributing currents. In this way, an accurate knowledge of the actual sensitivity of the toroid/signal cable system become progressively less important as the differential current is made smaller and smaller in relation to the two contributing currents, being a minimum when the differential current is zero. The burden of accuracy and the long term stability is transferred to the determination of the reference current. This can be done accurately and reliably using standard electronics located remote from the ozone and radiation environment that affects the toroid and signal cable.

Figure 27:
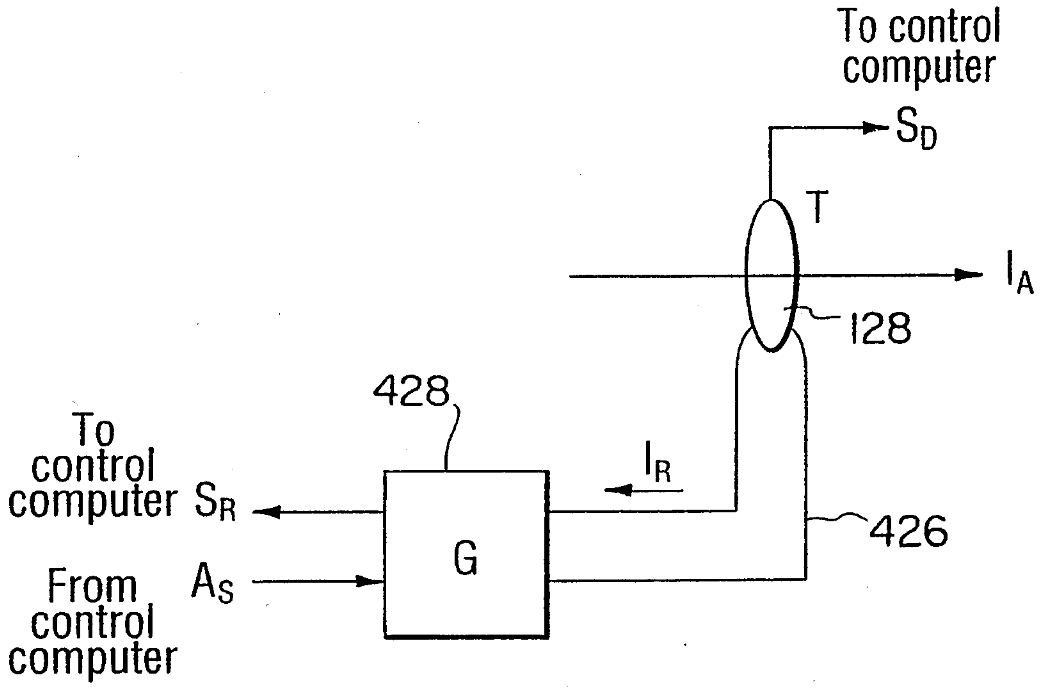
FIG. 27 is a schematic of a circuit for making a differential measurement used to determine the accelerated beam current according to the preferred embodiment of the present invention.

With reference to FIG. 27, current $I_A$ traverses the hole of the toroid 128 in the usual manner. The toroid outputs a signal $S_D$, which is fed to the machine control system which uses it in the control of the machine. Pulse generator 428 generates reference current pulses of magnitude $I_R$ synchronized and coincident with the beam current pulse to be measured. The output current is fed via a cable 426 through the same hole in the toroid that the beam current traverses and in a sense such that the reference current opposes the beam current. Standard control algorithms are used in the control system to determine the magnitude of the reference current required to drive the differential signal $S_D$ to zero. This information is transmitted to the pulse generator via signal $A_S$. The actual reference current delivered to the toroid is measured by separate electronics contained in the pulse generator and this information is sent back to the control computer via cable $S_R$. The control computer then calculates the actual beam current as the sum of the reference current $A_S$ and the differential current $S_D$.

A Quadrupole Doublet Magnet 130 comprises two soft iron quadrupole magnets with copper windings that are indirectly cooled by water. This magnet expands the electron beam from the output of the accelerator to reduce the thermal stress on the exit window and provides a larger spot diameter on the product. Power at low voltage is provided by two power supplies (not shown) located in the accelerator cabinet.

The scan horn and, hence, the dose distribution, is governed by software generated waveforms loaded into an arbitrary function generator. Output from the signal generator controls a bipolar power supply which drives the scanning electromagnet.

Scan magnet 22, in the form of a soft iron magnet with two indirectly-cooled copper windings, scans the electron beam across the titanium exit window 20 and hence across the product. Power at low voltage is supplied from a power supply located in the accelerator cabinet. A periodic 5 Hz waveform supplied by the power supply is generated by a scan waveform generator, also located in the accelerator cabinet.

Scan edge detectors 132, in the form of aluminum probes mounted on a moveable carrier, are used to detect the edge of the electron beam scan. The detectors are insulated with aluminum oxide insulators and mounted on aluminum brackets with bronze bushings that slide on stainless steel rods. The brackets are connected to a motor drive 134, located near the electron gun, with stainless steel cables (not shown). Electrostatic shields (not shown), made from titanium and aluminum, on the detectors prevent low energy electrons from reaching the detectors. Edge detector motor drive 134 includes a motor with geared speed reduction to move the scan edge detectors. The edge detectors are connected to a drum (not shown) on the speed-reducer output-shaft by a stainless steel cable. The position of the detectors is measured by a potentiometer (not shown) connected to the drum via gears. The motor and mechanisms are shielded by a lead box with walls about 50 mm thick. A window shield 136, in the form of an aluminum plate, is moved in front of the titanium exit window when the accelerator is not operating. The plate is moved by an air cylinder (not shown) connected to the plate by stainless steel cables (not shown). Microswitches (not shown) are used to sense the position of the plate when it is covering the window or fully retracted.

Two welded stainless steel headers 138 carry cooling water to the cooling channels in the accelerator sections. Deionized cooling water is circulated by the primary cooling system located outside the shielding. Curtain Transvectors 140, serving as air flow amplifiers, use compressed air to induce motion in free air and provide a large volume of air to cool the titanium window on the scan horn. A welded steel frame 142, called a "Strong Back", supports the accelerator, scan horn and all other accelerator components. A beam stop 144, located on the opposite side of the product irradiation plane from the scan horn, serves to absorb the electron beam and prevent it from impinging on the concrete floor or wall to prevent the electron beam from heating the concrete and causing it to spoil or deteriorate due to high temperature. The beam stop is made from aluminum with water cooling channels connected to a cooling circuit that is independent of the primary coolant circuit of the accelerator. A flow switch (not shown) is connected to the logic controller to prevent accelerator operation unless there is coolant flow through the beam stop. When the accelerator is mounted vertically, with the electron beam directed into the earth, failure of the beam stop will have no effect on the radiation field outside the shield. If the accelerator is mounted horizontally or vertically with the beam directed upward, failure of the beam stop is a safety issue. In the horizontal or vertical upward configuration, concrete will likely provide the necessary shielding and the beam stop must operate to prevent deterioration of the concrete. In these cases, a safety interlock must be provided to prevent operation unless there is coolant flow in the beam stop.

Rf Transmission

FIG. 10 illustrates the high power rf transmission system 30 which conducts rf power from the high power klystron 28 to the accelerator coupling section 100. Penetration for the waveguide through the shield is provided in the form of a maze. The rf transmission system conducts microwave power at about 110 kW average, 2.5 MW peak, at 1.3 GHz.

Straight Waveguide Sections 204 and Waveguide Elbows 206 interconnect the accelerator and the klystron. The straight waveguide sections are in the form EIA WR 650 waveguides made from copper with 2.38 mm walls and fitted with brass flanges at either end. Stainless steel picture frames and brass ribs provide strengthening to withstand internal gas pressure of about 200 kPa absolute without wall deflection greater than 1 mm. As mentioned earlier, the waveguide is pressurized with sulphur hexafluoride to provide the dielectric strength required for the rf fields. Directional couplers 208 and 210, located at the accelerator and at the klystron ends of the waveguide, provide rf signals that are proportional to the forward rf power (flowing from the klystron to the accelerator) and reverse rf power (flowing from the accelerator to the klystron). Flexible Waveguides 212 and 214 are provided to minimize the mechanical stress on the rf windows located at the accelerator and klystron. An rf microwave circulator 216 is provided to prevent reflected rf power from reaching the klystron and two water cooled rf loads 218 and 220 are provided to absorb the reflected power that is diverted by the circulator. Metal waveguide seals (not shown), provided with an integral elastomer gasket to seal both the rf and the internal waveguide gas atmosphere, are used between the flanges that join waveguide sections and other components.

Klystron & Modulator

Figure 11:
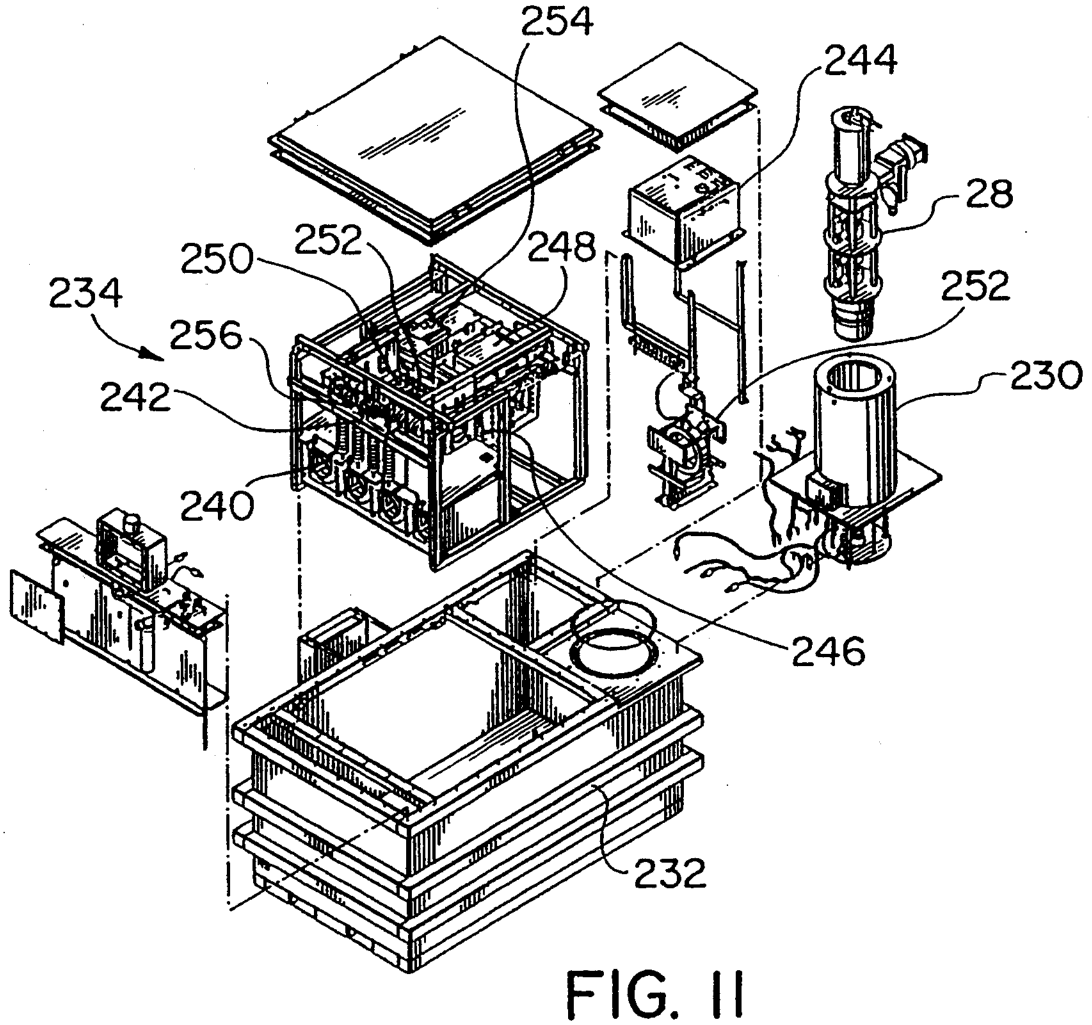
FIG. 11 is an exploded, perspective view illustrating the high power klystron, modulator according to a preferred embodiment of the present invention.

FIG. 11 is an exploded perspective view illustrating the klystron, a modulator 234 and a modulator tank 232. The high power klystron 28 is a vacuum tube in a metal envelope. It receives rf power at 1.3 GHz from a driver klystron at a pulse-power level of between 100 and 200 watts. The rf input is brought through a semi-rigid coax cable having a solid copper shield. The klystron amplifies the rf power to about 2.5 MW peak. The klystron output is connected to the WR 650 waveguide 210 of the rf transmission system that conducts the rf energy to the accelerator structure. The klystron is mounted within an electromagnet 230 which focuses the internal electron beam of the klystron. The klystron is mounted on top of an oil-filled modulator tank 232 with the lower portion of the klystron immersed in oil. The lower portion of the klystron is a ceramic section that supports the cathode and modulating anode. The oil provides cooling and the dielectric strength to withstand the high voltage on the cathode and modulating anode.

Modulator 234 is housed in a reinforced stainless steel modulator tank 232 that measures approximately 1.5 m by 2.7 m, and is 1.2 m high. The tank is fried with about 4000 L of PCB-free transformer oil that is circulated through an external parallel-plate heat exchanger at 100 L/min to remove heat to a water circuit. The tank is vented to atmosphere through a desiccant to permit air to pass when the oil volume changes because of temperature changes.

The main components in the modulator, illustrated in FIG. 11, which are immersed in the oil, include a capacitor bank 240, comprised of four 1.0 μF capacitors rated at 120 kV that, connected in parallel store the energy required to drive the klystron cathode in a pulsed mode. Each capacitor has a series 80Ω surge resistor to limit the energy deposition from other capacitors in the case of capacitor failure. A 15 MΩ resistor is permanently connected across the capacitors to discharge them after shutdown. A 30Ω, 7.5 kW surge resistor 242 with a 20 kJ rating is used to limit the short-circuit current during an internal klystron are. A klystron Deck 244, in the form of a Faraday cage, is maintained at the klystron cathode voltage that contains the klystron-filament power supply and the klystron off-bias power supply. A Switch Tube 246, in the form of tetrode vacuum tube rated at 120 kV, 10 kW, serves to switch the voltage at the modulating anode of the klystron, as explained more fully below with reference to FIG. 12.

Figure 12:
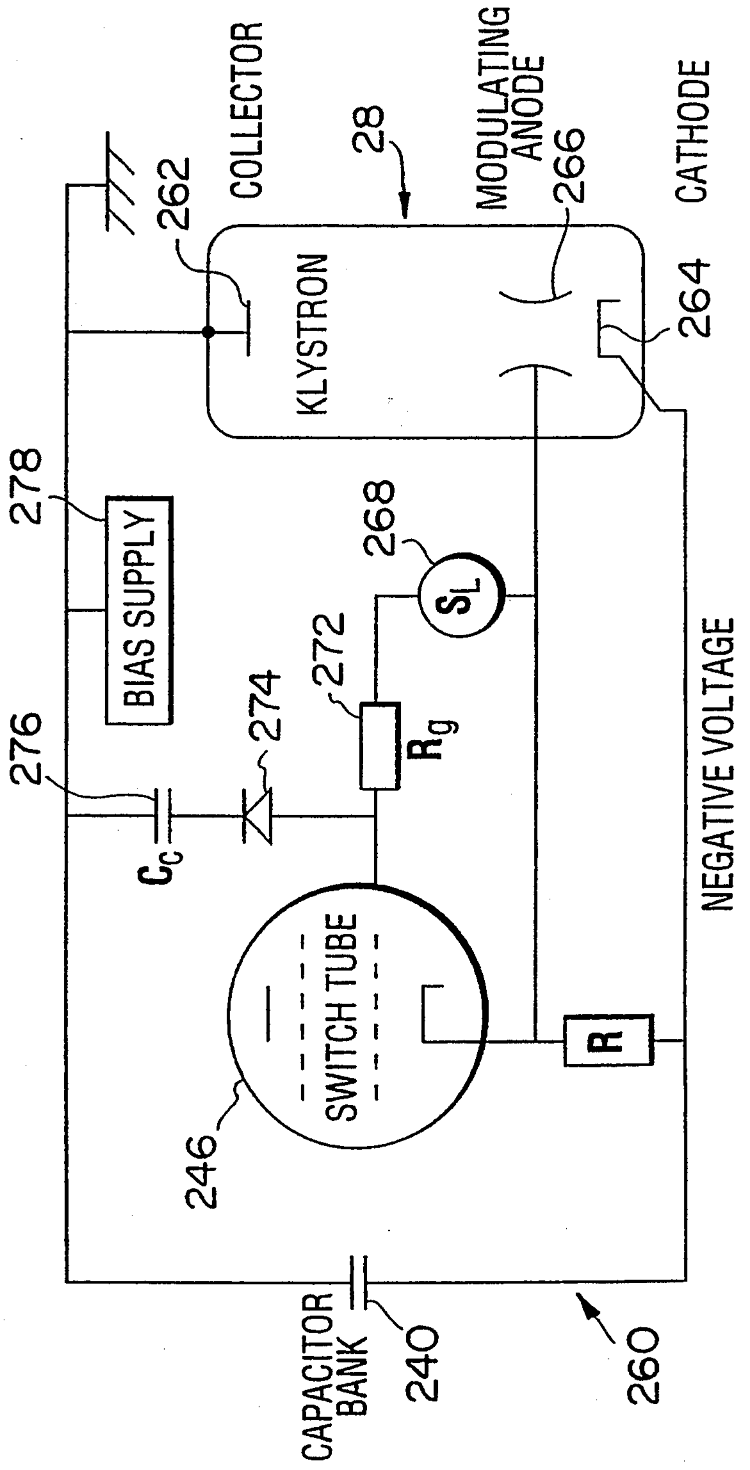
FIG. 12 is a circuit diagram of a klystron drive circuit according to the preferred embodiment of the present invention.

An On-Deck 248, in the form of a Faraday cage, is maintained at the klystron's modulating anode voltage that contains the switch-tube-filament power supply, and other low-power supplies and trigger electronics to drive the switch tube. A pull-down resistor 250 is part of the switch tube circuit to switch the modulating-anode voltage of the klystron. Isolation transformers 252 provide ac power to the on-deck and Klystron Deck. An on-bias capacitor 254, that is maintained at about −15 kV by the klystron on-bias supply in the klystron cabinet provides the ON state reference voltage to a tetrode switch tube (FIG. 12). A crowbar 256 includes two gas-filled spark gaps with a trigger electrode and a gasfilled high voltage relay. The spark gap and relay are both triggered by the highspeed machine protector system 38 to discharge the capacitor bank.

As previously mentioned, the power for a pulsed electrical load is often derived from the electrical energy stored in a capacitor bank. The high discharge pulse current generally causes the voltage on the capacitor to droop significantly during the pulse, thereby changing the operation of the driven load during this time. A klystron is an example of such a driven load. In the preferred embodiment of the present invention, the klystron is rated for megawatt-level pulsed operation. The average power handled by this device is between 200 kW and 400 kW. As already mentioned, the klystron used in the preferred embodiment of the present invention is a so-called rood-anode (modulated anode) klystron, having three major electrical terminals aside from a heater connection. With reference to FIG. 12, the first terminal is collector 262 which is always maintained at ground potential. The second is cathode 264 which is maintained at a high, constant negative potential of the order of 100 kV by a separate power supply. The third is modulated anode 266, also referred to as "mod-anode " which is at some intermediate "on-state " voltage while the klystron is conducting current and amplifying the rf pulse. To conserve electrical power, the mod-anode is held near the cathode "off-state " potential between pulses, thus preventing the tube from conducting current and dissipating power when rf amplification is not required. The on-state voltage is determined by a second, separate power supply.

A klystron is often driven by a circuit which includes a switch, a pull-down resistor and the capacitor bank to store the charge for the current pulse through the klystron. When the switch closes, the klystron conducts current and can be used to amplify rf power. The declining voltage during the pulse affects both the cathode potential and the modulated anode potential in such a manner that the accelerating potential, i.e. the difference between the two, changes during the pulse. This circuit is not adequate if a controlled, predetermined change in the accelerating potential is desired. It has been proposed to employ a programmable variable-voltage power supply to achieve a controlled accelerating potential.

Referring to FIG. 12, the present invention provides a klystron drive circuit 260 for driving klystron 28 which provides the rf power required to operates the accelerator structure. The circuit which includes switch tube 246 triggered by a low power switch 268 in order to divert a part of the current that flows through pull down resistor 270 during the pulse through a grid-leak resistor 272 in the switch tube circuit and from there through a diode 274 to a small capacitor 276 connected to ground. A bias supply 278 is provided to properly bias the diode. With the current during the pulse flowing through the capacitor, the magnitude of the voltage on the capacitor will decrease, drawing the modulated anode voltage with it. By the proper choice of grid-leak resistor, capacitor and the output impedance of the bias supply, the rate of voltage decrease during the pulse can be set to a predetermined value. Although this implementation involves the use of a switch tube, it will be understood that the same principle can be used with transistors as switching elements.

At commissioning time, the klystron is adjusted to optimize its conversion of electrical power to rf power. However, as the tube ages, and its characteristics change, its operating point may no longer be at the optimum for maximum power efficiency, leading to wasted electrical power. In conventional systems, regular adjustments are required to maintain rf efficiency. These require the machine to be out of service for the duration of the adjustment, causing a loss of revenue for the end user. While the accelerator is running, a certain mount of pulsed rf power is required to achieve the desired radiation field at the product. This amount varies, depending on the desired beam conditions. Furthermore, the voltages on the cathode and the mod-anode change during the pulse, as already explained, affecting the rf gain of the klystron. Active intra-pulse control of this power is therefore incorporated into the control system of the accelerator, as also just explained. However, for a given rf output of the klystron, there are two major electrical parameters that determine conversion efficiency. These are the cathode and mod-anode potentials and are the parameters that require adjustment at commissioning time and throughout the life of the klystron to maintain maximum rf conversion efficiency. For maximum efficiency, the klystron is normally operated "in saturation", but this is not possible in this instance due to the need for active rf power control.

The solution to this problem resides in accepting a rather infrequent off-line adjustment of the cathode voltage but relying on active control of the rood-anode on-state voltage to continually maximize rf efficiency. The on-state power supply for the mod-anode is arranged, through standard electronics, to be a programmable power supply so that its output voltage can be controlled by an external signal. Using the logic controller, the rf conversion efficiency is determined by dividing the rf output power signal by the input power signal. Since the rf conversion efficiency is, in general, not as monotonic function of the on-state voltage, standard proportional-integral -derivative (PID) algorithms cannot be used in a standard feedback loop to find the efficiency maximum. Instead, the present invention uses a search algorithm where the voltage of the on-state power supply is changed by a small increment and its effect on the efficiency is observed. The correction is continued in the same direction if the efficiency is improved and in the reverse direction if it deteriorated. In this way, the on-state voltage will always be near the point of maximum rf conversion efficiency.

Cooling System

A primary cooling system comprises a de-ionized water circuit that is vented to the atmosphere at a water reservoir (not shown), the highest point in the circuit. De-ionized, low-conductivity water is circulated through accelerator components, klystrons and heat exchangers by an electrically driven pump (not shown). The heat is taken from the primary cooling system to a secondary system (not shown) through a plate heat exchanger (not shown). Heat from the secondary system is deposited to the environment through water or air. The secondary cooling system contains a water to air heat exchanger (not shown) or, alternatively, discharges the secondary water to a large body of water. If an evaporative cooler tower is used, its air fans may be used to control the temperature of the secondary water. The secondary side includes a control valve (not shown) situated as a bypass or in series with the heat exchanger to control the flow and hence the primary system temperature. The valve position is controlled by a signal from the PLC in order to maintain the primary water temperature at the exit of the Primary Heat Exchanger at 35° C.

The main components of the primary cooling system comprise a primary heat exchanger which includes a stainless steel plate heat exchanger to cool 575 L/min of water from 50° C. to 35° C., an electrically-driven, make-up pump capable of providing 10 m of head at 30 L/min to fill the cooling system, an electrically-driven primary pump to circulate water in the primary cooling circuit at a flow rate of 600 L/min of water at 73 m of head, an electrically-driven oil pump to circulate oil from the modulator tank at a flow rate of 120 L/min at 14 m of head, a brazed stainless-steel plate Oil Heat Exchanger for transferring heat from the modulator oil to the primary cooling circuit and maintain the oil at about 40° C., ion exchange tanks for maintaining the water chemistry at a conductivity level below 10 mS/m (a resistivity greater than 10 kΩ m), a water reservoir, in the form of a stainless steel tank, vented to atmosphere to provide a reservoir of water and accommodate the expansion of the water in the primary cooling circuit and an oil reservoir, a stainless steel tank, for accommodating the expansion of the oil in the modulator tank.

The main components which are cooled by the primary circuit are the rf elbow and rf window at the accelerator, the circulator and its water loads, the klystron body, rf window, electromagnet and collector, the driver klystron, the accelerator structure, beam delivery components, and the 200 kW rf water load used during the klystron commissioning.

There are many parallel flow paths in the primary cooling circuit and therefore instrumentation is used to confirm flow in all paths. There is a flow switch or flow meter in each parallel path and their outputs are taken to the PLC. The PLC checks the status of each flow transmitter and shuts down the accelerator if flow is not adequate. The flow switches and flow meters are equipped with visual readouts to facilitate flow balancing and other diagnostics. The primary cooling system is also fitted with pressure transmitters, visual pressure gauges, resistance temperature devices (RTDs), and temperature and level switches for diagnostics.

The cooling system interconnections are type L copper tubing and stainless steel tubing and fittings. Flexible rubber hoses are used outside the shielding for connection to rf components. Isolation and flow balancing valves are made from either bronze or stainless steel with the use of brass kept to minimum. The pressure of the system is restricted to 600 kPA gauge by the pressure rating of some components.

Klystron Power Supply

A Klystron Power Supply (KPS) provides the power to operate the high power klystron. The KPS charges and maintains the Capacitor Bank in the modulator to its output voltage. It is connected to the capacitor bank in the modulator tank via two coaxial cables with shields grounded at the KPS and Modulator Tank. The KPS is a dc, variable-voltage, continuous-duty, power supply with the output voltage and current limit controlled by logic controller 30 and includes a fast electrically-operated primary disconnect. The KPS circuitry includes a 12-pulse transformer-rectifier set, an SCR control of primary voltage, a nominal full load primary current 700 A, 10-cycle SCR surge rating, 13,000 A, delta primary to dual extended delta secondaries, a closed-loop control circuit which uses voltage and current feedback via fibre-optic cables between the controller and the transformer-rectifier tank. Power input is three-phase, 3-wire, 47 to 63 Hz, 480 V or 575 V, 600 kVA. Output is negative, variable, from 5 to 110 kV, 0 to 4.77 A with impedance 6 to 7%. The SCR controller is located in a locked, and interlocked, steel electrical cabinet. The step-up transformer and rectifier diodes are located in a sealed, oil-filled steel tank (not shown) approximately 2.0 m by 1.5 m, by 1.9 m high, with bolted-on lid incorporating a pressure-relief valve. Safety devices are provided to cause a shutdown in the event of loss of a phase, loss of a cooling fan, open door on SCR controller cabinet, oil over-temperature and tank over-pressure.

As mentioned previously, fast shutdown systems are required for linear accelerators to protect high power subsystems from damage. In particular, the shutdown systems are required to discharge the electrical energy stored in the rf power system in the event of anomalous conditions, to extinguish arcs in the rf power delivery system, preventing damage to the waveguide and components, to extinguish arcs in the linear accelerator, minimizing damage to the interior of the accelerator and protecting the rf power system from reflected power, to prevent anomalous rf drive conditions from damaging expensive components, to prevent deposition of excessive accelerated beam current on sensitive elements of accelerator beam delivery system, and to disable accelerated beam current in the event of a failure of the beam dispersal subsystem.

The topology of a modem high-power accelerator has the major components distributed as appropriate to the requirements of the facility. In such a facility, the components that contribute to the decision that a fault condition exists may be separated from each other as well as from the logical point of action for the decision. The speed of decision and maximum delay to the protective action required are different depending on the characteristics of the fault condition and the tolerance of the affected components for the resulting stress. In many cases, the speed of detection and action exceeds the capabilities of the process control system by several orders of magnitude: a few microseconds as opposed to tens or hundreds of milliseconds. Hence, fast hardwired protection systems are required.

Conventional protection practice depends, in part, on the design of the accelerator and the limitations imposed by the component manufacturer. For example, until recently, most control systems have been arranged with each signal carried by individual wires to the control room for monitoring and alarm functions. Modem distributed control system designs permit reducing the number of signal cables that enter the control room, with most data being acquired remotely and telemetered via multiplexed digital communication from clustered points. An alternative practice is to provide a high speed detection function at the point of measurement, relay the decision to the control room where it may be logically conditioned and relay the instructions to the protective action point.

The multiple cables required for the conventional schemes carry cost penalties for the cable and installation, have multiple length signalling delays, and are vulnerable to the electromagnetic interference unless high cost optical-fibre systems are used. For specific types of faults, the associated electrical disturbance may be sufficient to defeat the communication function and to prevent protection. The system may also be vulnerable to spurious trips arising from external sources of electromagnetic interference.

These difficulties are overcome by the present invention by the provision of a single communication cable configured as a fall-safe current loop and used for high speed signalling of many protection decisions to one or more activation devices. The optically-isolated communication in the fail-safe sense is achieved with high speed by using a complementary logic drive to discharge the base capacitance of the primary optical isolator with a second optical isolator. The noise immunity for each decision is selected on the basis of the impact of the related fault condition permitting a unique false-alarm/missed-alarm tradeoff for each condition.

The high speed protection system of the present invention employs several key elements. It includes a current loop that is optically-isolated at each connection and chained through each decision device and action module. The current loop is enabled by the supervisory control system to permit testing and logical control. The current loop is arranged to be fall-safe in that a loss of continuity in the loop cable causes the action device to operate and the head-end control to latch the loop in an open state until it is reset. Decision modules employ the full sensor bandwidth available for detection and provide a selectable sustain criterion for the decision as well as limited provision for logical conditioning based on parameters monitored in other modules. A high quality digital communication cable is used for the current loop with the shield connections arranged for high noise immunity. Fault detection circuits are conditioned on the current loop being closed to ensure that, within the signalling delay, only the first fault to be detected is latched for diagnostic purposes. Each signal used for a protection function is separately measured by the supervisory process controller to validate the signal.

Gun Cabinet

The gun cabinet 280 contains the power supplies and electronic control circuitry to operate the electron gun. Control signals originate from logic controller 30 and machine timing generator 34 via a fibre optic link and wired control signals from the rf cabinet. A three phase and a single phase ac power connection provide power to the cabinet. The outputs from the cabinet are the gun high voltage, the Wehnelt voltage and the heater power carded to the electron gun on a single cable.

Figure 14:
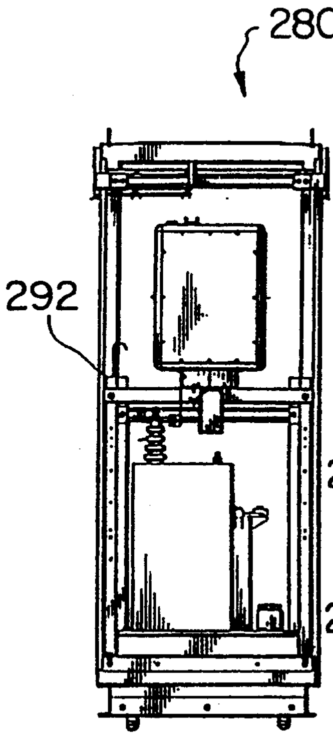
FIG. 14 is a side elevational view of the electron gun cabinet illustrated in FIG. 13.
Figure 13:
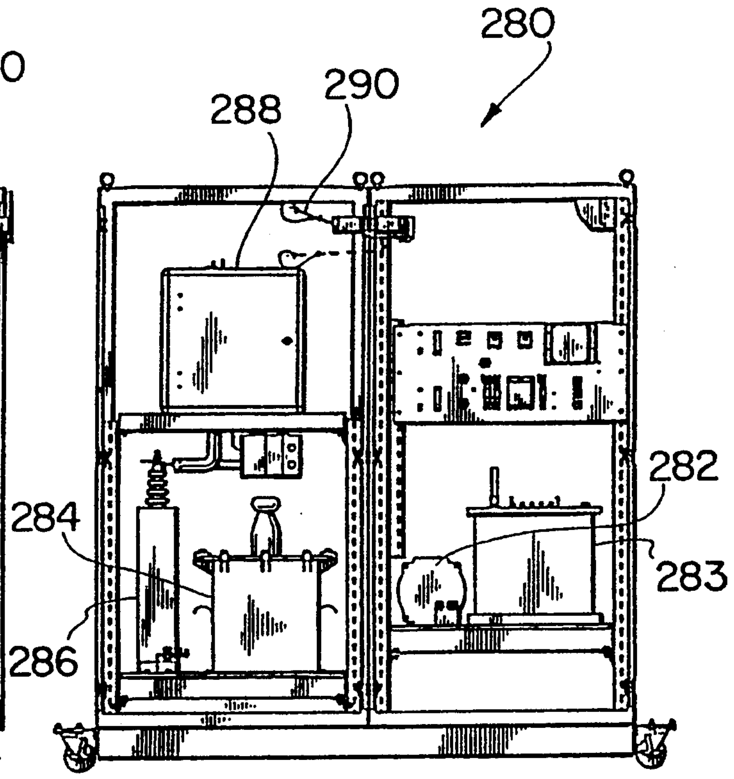
FIG. 13 is a front elevational view diagrammatically illustrating the electron gun cabinet in accordance with the preferred embodiment of the present invention.

The main items in the gun cabinet are identified in FIGS. 13 and 14 include a control deck 280 having a power control panel with a single phase and three phase breaker, a three phase contactor, surge arrestors, fuses and a circuit board to provide measurements of the high voltage and currents, a three phase autotransformer 282 for adjusting the three phase voltage supplied to the 60 kV power supply, adc High Voltage (I-IV) Power Supply 283 with a rated output of 60 kV-80 mA average that charges the capacitor to its output voltage. The input to the HV Power Supply is three phase 208 V. The pulse current of 500 mA to the Electron Gun is delivered mainly from the capacitor. The main output is on a high voltage coax cable and there is also an output to provide a measurement of the output voltage. The gun cabinet further includes a 120 V ac isolation Wansformer 284 rated at 70 kV de between primary and secondary, a 0.5 pF capacitor 286 rated at 70 kV de to filter the I-IV and deliver the pulse current required by the electron gun, a Faraday cage gun deck 288 that contains the power supplies and electronic circuitry to operate the electron gun. Control signals are transmitted to the deck-via a fibre optic cable. Control power is provided by the isolation transformer. This cage is at the output voltage of the HV Power Supply when the three phase power to the cabinet is turned ON. A grounded metal lever 290 that is lowered onto the gun deck from outside the cabinet is provided to discharge the Faraday cage before opening the cabinet and a plastic rod grounding stick 292 with a metal hook that is connected to the cabinet's main ground lug with a braided cable to ground circuit components after opening the cabinet door.

Driver & RF Cabinets

Figure 15:
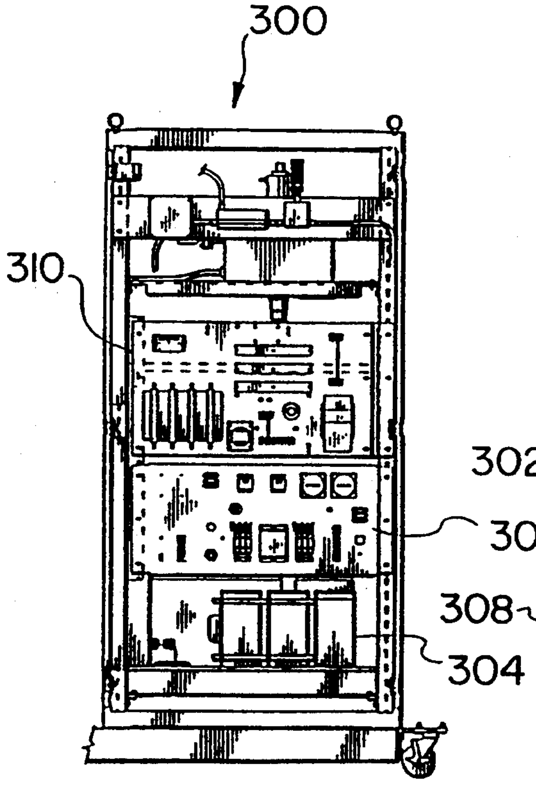
FIGS. 15 and 16 are front and back elevational views, respectively, diagrammatically illustrating an rf driver cabinet in accordance with the preferred embodiment of the present invention.
Figure 16:
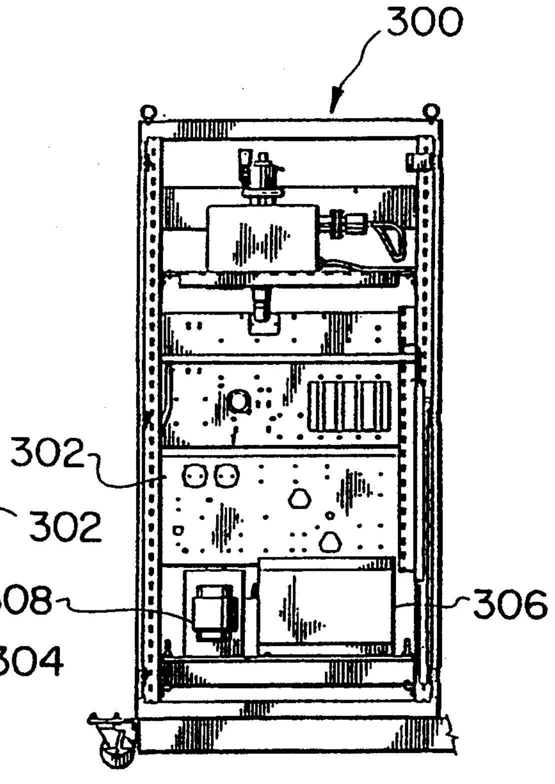

The Driver Cabinet 300 contains a small klystron that provides the rf drive to the high power klystron. The rf Cabinet contains an rf Exciter, an rf amplitude controller, a High Speed Signal Processing (HSSP) chassis and power supplies that supply services and control the rf power. Interlock switches on the cabinet doors disable the three phase power to the 7 kV power supply when the door is opened. The main items in the driver cabinet, shown in FIGS. 15 and 16, comprise a power supply deck 302 which includes a control panel with three phase circuit breakers, a contactor, surge arrestors, solid state relays and timers, a three phase autotransformer 304 for adjusting the three phase voltage supplied to the 7 kV Power Transformer, a three phase 7 kV power transformer 306 that provides power to the klystron, a 5 pF capacitor 308 rated at 10 kV to filter the 7 kV dc power, a high voltage deck 310 which includes an insulated panel with rectifiers, power resistors and other instrumentation. The components on this panel are at 7 kV de. The driver cabinet further includes the driver klystron 312, a 1.3 GHz klystron with a rated output of 1 kW cw with input rf from the rf amplitude controller in the rf Cabinet. Output rf is fed to the high power klystron in the modulator tank.

Figure 17:
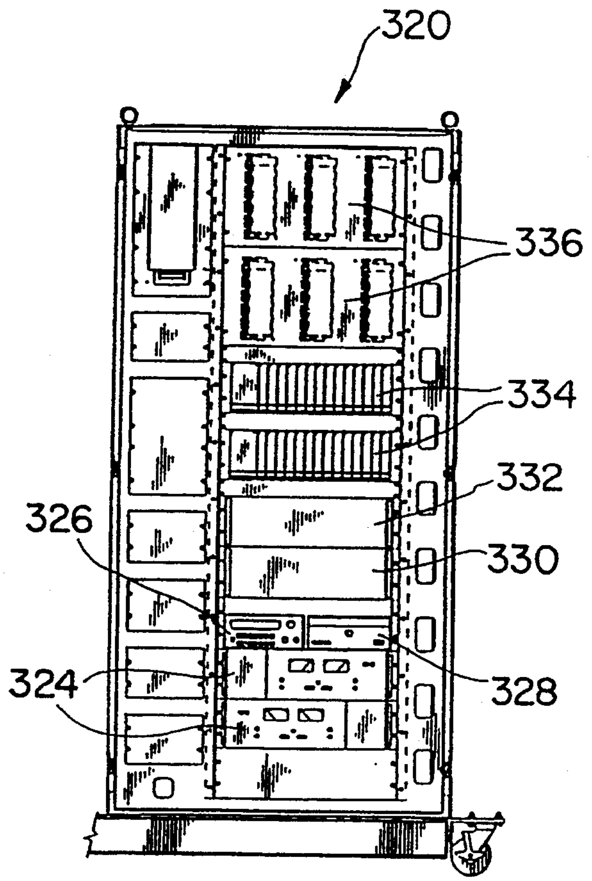
FIGS. 17 and 18 are front and side elevational views, respectively, diagrammatically illustrating rf cabinet in accordance with the preferred embodiment of the present invention.
Figure 18:
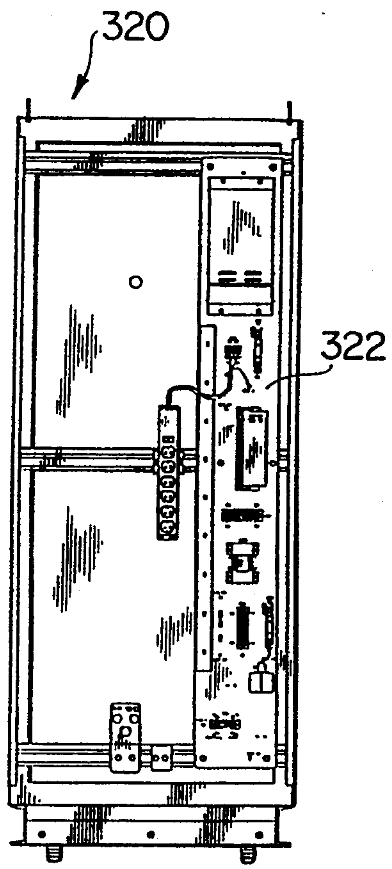

The rf Cabinet 320, shown in FIGS. 17 and 18, includes a power panel 322 with a line regulation transformer, circuit breakers, contactors, surge arresters and one discrete Genius block to convey discrete parameters to and from the PLC, low voltage bipolar power supplies 324 that supply power to the steering coils in the Electron Gun Optics assembly, a frequency counter 326 to measure the frequency of the rf supplied by an exciter 330, a bus interface 328 in the form of an IEEE-488 to RS-422 interface converter for the Frequency Counter, an exciter 330 which is a custom designed rf package that contains a low power 1.3 GHz Voltage Controlled Oscillator (VCO), rf switches, attenuators and directional couplers. The frequency of the VCO is adjusted by logic controller 30 to match the resonant frequency of the accelerator structure. The rf cabinet further houses an rf amplitude controller 332 which controls the amplitude of the rf in the accelerator structure. The rf amplitude setpoint is supplied by the logic controller and the feedback signal is obtained from rf crystal detectors connected to the rf field probes in the accelerator structure.

A High Speed Signal Processing Chassis 334 contains circuit boards that process the high speed signals from the accelerator, klystrons, klystron power supplies and electron gun. The circuits includes sample and hold circuits to sample pulses and high speed machine processing circuits to inhibit the rf or fire the Triggered Spark Gaps and dose the High Voltage Relay. The actions initiated are to protect the machine from damage. Genius Modules 336 are mounted on a panel with discrete and analog Genius modules to convey analog and discrete signal to and from the logic controller.

Figure 19:
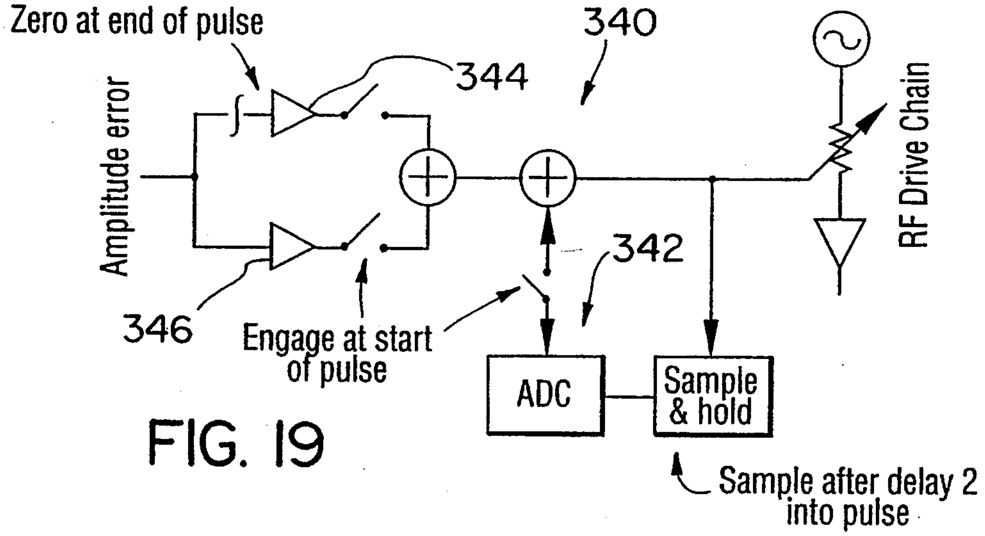
FIG. 19 is an electrical schematic diagrammatically illustrating a control circuit for generating a pulse control signal according to the preferred embodiment of the present invention.
Figure 20:
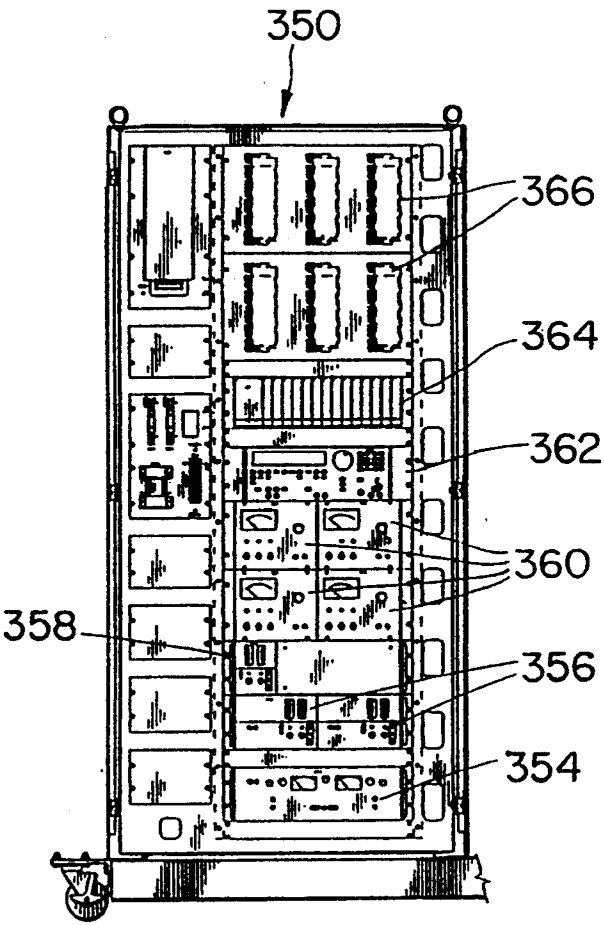
FIGS. 20 and 21 are front and side elevational views, respectively, diagrammatically illustrating the accelerator cabinet in accordance with the preferred embodiment of the present invention.
Figure 21:
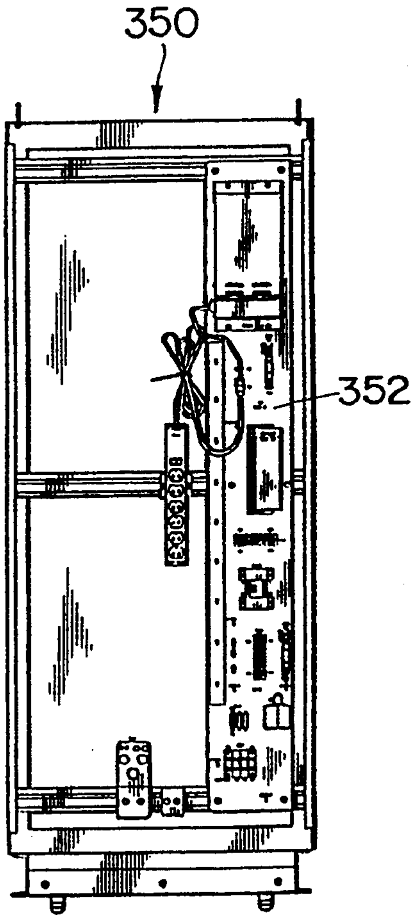

The present invention proposes a controller which consists of broadband yet simple proportional-integral analog control circuit 340, illustrated in FIG. 19, which includes a single analog-to-digital converter (ADC) 342 configured as a zero-droop sample and hold and a parallel circuit containing an integrating amplifier 344 and a proportional amplifier 346 which receive the control signal at their respective inputs and their outputs are connected to the input of the ADC. Amplifier 346 is engaged at the start of each control pulse. After a first predetermined time delay from the start of each pulse, the integration amplifier 344 is engaged and applied to the ADC and, after a second short time delay, the control signal is sampled and stored in the ADC. At the end of the pulse, the integration term is zeroed. At the start of the next pulse, the control signal is set to the value stored in the ADC and the proportional control term, the output of amplifier 346 is engaged. The cycle repeats for each pulse. The method provides both fixed intra-pulse regulation and pulse-to-pulse regulation with simple electronics. Storing the control signal for use on the subsequent pulse and the staged deployment of the controller terms, effectively removes the deadtime between pulses, thus attaining the performance of a continuous system with a pulsed system.

Accelerator & Klystron Cabinets

The Accelerator and Klystron cabinets, FIG. 20, 21, 22 and 23, respectively, contain the power supplies, ion pump controllers and instrumentation to provide services to the accelerator, high power klystron and modulator. The main items in the Accelerator Cabinet 350, shown in FIGS. 20 and 21, comprises a power panel 352 which includes a line regulation transformer, circuit breakers, contactors, surge arresters and one discrete Genius block to convey discrete parameters to and from logic controller 30, a scan magnet power supply 354 with a rated output of 72 V-6 A dc to drive the scan magnet, two quadrupole power supplies 356 power supplies with rated outputs of 55 V-5 A de to provide power to the quadrupole doublet magnets, a gap lens power supply 358 with a rated output of 15 V-6 A de to provide power to the gap-lens focus-magnet in the electron gun optics assembly, ion pump controllers 360 with a rated output of 5.2 kV-200 mA dc to provide power to the ion pumps on the electron gun, accelerator structure vacuum manifold and scan horn. A scan waveform generator 362, an arbitrary waveform generator, provides the scan waveform for the scan magnet via the scan magnet power supply. An high speed signal processing chassis 364 and Genius Modules 366 are also mounted in this cabinet as mentioned earlier in connection with the description of the rf cabinet.

Figure 22:
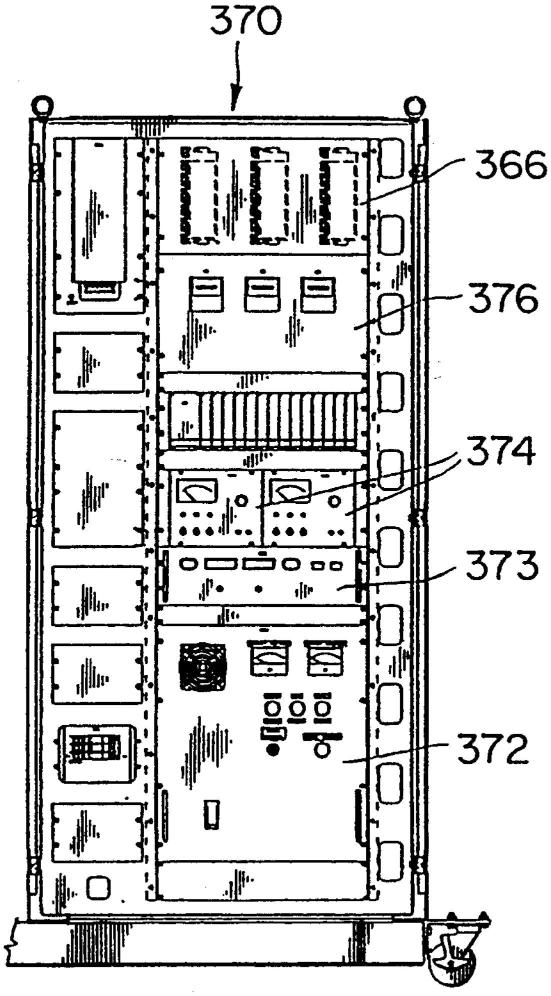
FIGS. 22 and 23 are front and side elevational views, respectively, diagrammatically illustrating the klystron cabinet in accordance with the preferred embodiment of the present invention.
Figure 23:
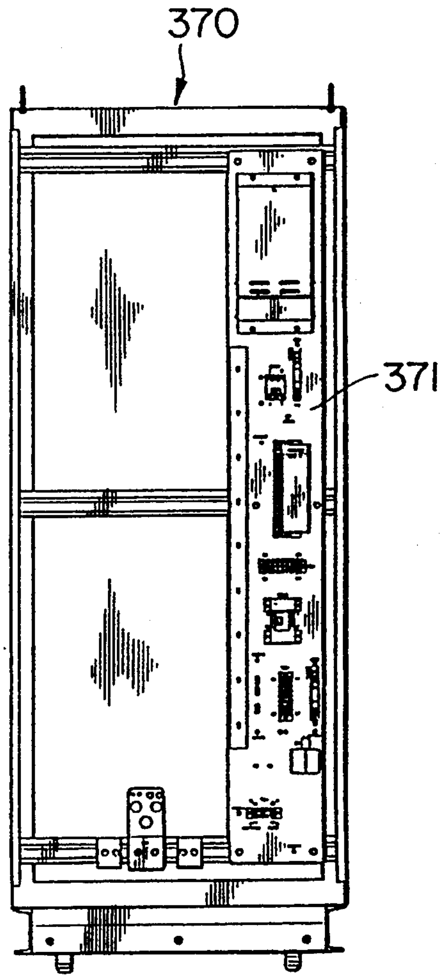

The main components in the klystron cabinet 370, shown in FIGS. 22 and 23, comprise a power panel 371, as mentioned above, an electromagnet power supply 372 with a rated output of 170 V-65 A de to power the focus electromagnet 230 (FIG. 11) on the high power klystron, a klystron on-bias power supply 373 with a rated output of 30 KV-10 mA de to provide the ON-state bias voltage to the modulating anode of the high power klystron, ion pump controllers 374 with a rated output of 5.2 kV-200 mA de to provide power to the ion pump on the high power klystron and the ion pump on the accelerator structure's waveguide elbow, and time meters 376 to accumulate the ON time of the klystron power supply, klystron filament and tetrode filament. The klystron cabinet also includes genius modules 366.

Control Cabinet

The control cabinet (not shown) contains the programmable logic controller 40, an Uninterruptible Power Supply (UPS), and the machine timing generator 44. This cabinet is located in a control room, near the control console. The UPS is a power supply with battery storage to provide about 10 minutes of operation without line power. The UPS provides power and surge protection for the logic controller 40, the timing generator 44 and the human machine interface 42. The machine timing generator 44 provides all timing pulses to the modulator and control circuits. Five pulse outputs are transmitted to the high speed signal processing chassis in other cabinets. The output power of the accelerator is controlled by changing the pulse length and pulse repetition frequency (PRF) generated by the timing generator. The timing generator is controlled by commands from the logic controller. The logic controller is a GE-Fanuc Series 6 programmable logic controller with the Genius I/O system. The Genius bus controller in the logic controller controls a high speed serial bus that is connected to the Genius I/O modules in the cabinets. The logic controller also contains modules to provide serial input/output to the human machine interface, the machine timing generator, the frequency counter and the data logger.

There is also an I/O control module that provides a parallel interface to the programming device, an IBM AT (trade mark) compatible computer. The control system program is loaded into the logic controller from a floppy disk on the programming device. The program is retained by the logic controller in battery backed-up memory and does not require reloading unless there is a hardware failure. The programming device is not connected during routine operation of the accelerator.

The control system program in the logic controller provides interlocks, alarms and automated sequences for operating the accelerator. It does not contain personnel safety measures with the exception of a light that informs personnel that the accelerator is producing a beam. The controller contains an alarm relay output that is independent of the Genius I/O system. An alarm output is generated if there is a CPU or I/O parity error, CPU self test failure, CPU watchdog time out, low battery backup voltage, CPU power supplies out of tolerance or the CPU power supply is turned off. The alarm output is used to turn off the electron gun high voltage and the klystron high voltage. Thus radiation is not produced unless the PLC is functioning.

Control Console

The control console contains the human machine interface 42 and the Operations Panel. The interface is an industrial computer (IBM AT compatible) with a 19 inch colour display, an operator keyboard and an alarm printer. Data from the logic controller is displayed to the operator or printed on the alarm printer and commands from the keyboard are sent to the logic controller. There are about 18 display pages available on the interface that are used primarily for commissioning and maintenance. The operator may inspect any page but data input is restricted to input by commissioning and maintenance personnel by the use of passwords.

Figure 24:
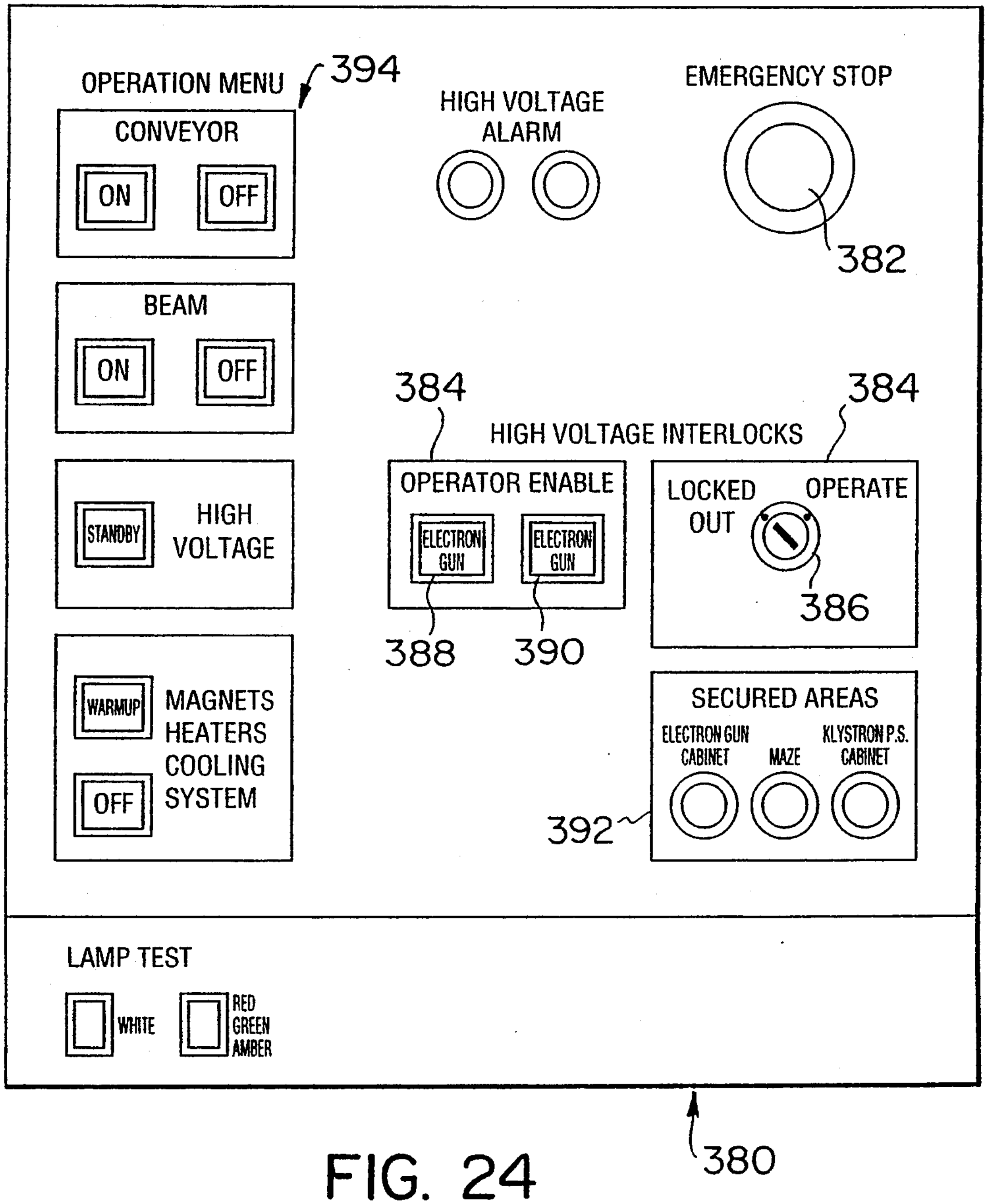
FIG. 24 is a diagrammatic view of the operation panel in accordance with the preferred embodiment of the present invention.

Routine operation of the accelerator is via the Operation Panel 380 shown in FIG. 24. The panel consists of hand switches and lights that interface to the logic controller and to the rf, high voltage and radiation protection systems. The items on the operations panel include an emergency stop push button 382 to turn off the electron-gun power-supply and the KPS power supply and disable their interlocks. High Voltage Interlocks 384 include lamps and switches that are connected to relay interlock logic. The three lamps at the bottom show the status of the secured areas. A key switch 386 with a removable key is used to lock out the high voltage interlocks. The ELECTRON GUN and KLYSTRON P.S. push buttons 388 and 390, respectively, are used to enable operation of the electron gun and klystron high voltage power supplies.

The lamps in the SECURED AREAS panel 392 are green when the local interlocks in the three areas are satisfied: the lamps are extinguished when interlocks are not satisfied. The ELECTRON Gun and KLYSTRON P.S. push buttons have two integral lamps, white and green. The white lamp is lit when the interlock logic preceding the push button is satisfied, i.e. an action will occur if the operator pushes a button that is white. When the operator pushes a button and a high voltage power supply is enabled, the white lamp is extinguished and the green lamp is lit.

An Operation Menu 394 includes seven push buttons connected to the PLC that are used by the operator to bring the accelerator into operation. The buttons have integral white and green lamps. The white lamp is lit when the logic preceding the push button is satisfied, i.e. the action will begin if the button is pushed. When the operator pushes the button and the action begins, the white lamp is extinguished and the green lamp flashes. When the action is complete the green lamp is lit steady. Relay contacts from the high voltage interlocks prevent the PLC from turning on the high voltage unless the interlocks are satisfied.

Operation

Before the accelerator can be put into routine operation, it must first be conditioned. The coupling between a standing-wave accelerator structure and its microwave power source depends on the beam current accelerated in the structure. The accelerator structure is designed to be over-coupled when there is no electron beam present, critically coupled at the design beam current and under-coupled when the accelerated beam current exceeds the design beam current. Microwave power is reflected from the accelerator structure back to the source when the accelerator structure is over-coupled and under-coupled. When the source microwave frequency is the same as the accelerator resonant frequency, all of the power is transmitted into the accelerator structure when it is critically coupled to the source. This is the ideal condition for the operation of the accelerator.

The coupling between the accelerator structure and the microwave source is set by the dimension of the iris aperture in the coupler section and that dimension is fixed for a given iris aperture plate. When the accelerator is started up for the first time, the accelerator must be conditioned to support the accelerating field and the current flowing at the surface of the microwave cavities. The conditioning is done by gradually increasing the rf power in the accelerator structure. This conditioning is done without the electron beam because the beam transmission losses are excessive at low accelerating field gradient and could damage the structure. Thus, the accelerator is over-coupled during conditioning.

During conditioning of an over-coupled accelerator structure, a significant amount of the power transmitted by the microwave source is reflected back to the source. The source must be protected from the reflected power with a circulator (circulator 216 mentioned earlier) inserted in the waveguide transmission system between the source and the accelerator structure. The mount of reflected power is typically about 30% of the forward power. This results in a standing-wave building up in the waveguide transmission system, with high-field points that trigger electrical breakdown in the waveguide that could damage the waveguide or the microwave source and increase considerably the time needed to condition the accelerator.

According to the present invention, this problem is overcome by providing an iris aperture plate that ensures that the accelerator structure is critically coupled to its microwave source during the conditioning process, i.e. that couples the source to the structure without a beam present, and, after the accelerator has been conditioned, replacing the iris plate with a new iris aperture plate that critically couples the accelerator structure for beam operation. Heretofore, this has not been done because the vacuum seal in the accelerator structure must be broken and the waveguide must be pressurized and installing a different iris aperture plate might trap gases between the plate and its seat which might ultimately adversely affect the performance of or damage the accelerator. This method significantly improves the time required for conditioning. It eliminates the build-up of standing waves in the waveguide transmission system that could damage the waveguide, the circulator and the microwave power source by electrical breakdown of high field points.

Under routine operation, the sequence to bring the accelerator into operation is as follows. The operator may press the WARMUP push button on the operation menu at any time. This sends a signal to the logic controller which turns on the filaments (heaters) on the electron gun, switch tube, driver klystron and the high power klystron, turns on the power supplies that drive the magnets and turns on the cooling system.

Before the operator is permitted to enable the high voltage power supplies, three areas must be secure, the electron gun cabinet, the shielding maze and the klystron power supply cabinet. Each of these areas has a local hardware interlock system with a status output. When these interlocks are satisfied, the green status lamps are lit. Next, the operator may turn the key switch to the OPERATE position (if it is not there already). The operator then presses the ELECTRON GUN and KLYSTRON P.S. switches to enable operation of the high voltage power supplies.

Once the High Voltage interlocks have been satisfied and the warmup of filaments is complete, the operator may press the STANDBY push button on the Operations Menu. This sends a signal to the logic controller which turns on the high voltage. At this point, it is possible to produce radiation because of leakage currents, but a useful electron beam is not being produced. The operator may then press the BEAM ON push button to turn on the rf power and the electron gun and begin producing electron beam. The operator may then press CONVEYOR ON to begin irradiating product.

The CONVEYOR OFF button is used to stop the conveyor and the BEAM OFF button is used to stop the electron beam. Pressing the STANDBY button will also mm the beam off. Pressing the WARMUP button will turn off the high voltage power supplies. Pressing the OFF button turns off all power except to the low power electronics and the ion-pump controllers.

Above the EMERGENCY STOP button on the Operations Panel, there is a red and an amber HIGH VOLTAGE ALARM lamp to warn the operator of failure in the relay logic or ac power contractors. The red HIGH VOLTAGE ALARM lamp is lit and an audible alarm is raised in the control room if the ac power to the Electron Gun or Klystron power supplies is requested to be off but ac power is sensed on the load side of the contractors. The alarm also activates the illuminated sign to inform personnel that radiation is present inside the shielding. A validation alarm is also provided to ensure the alarm circuit is functioning. The amber lamp is lit if ac power if requested to be on but it is not sensed on the load side of the contractor.

The embodiments of the invention in which an exclusive property of privilege is claimed are defined as follows:

1. An electron linear accelerator for use in industrial material processing, comprising:

an elongated, resonant, electron accelerator structure defining a linear electron flow path and having an electron injection end and an electron exit end, means at said injection end for producing and delivering one or more streams of electrons to said electron injection end of said accelerator structure during pulses of predetermined duration and of predetermined repetition rate, said accelerator structure being comprised of a plurality of axially coupled microwave cavities constructed to resonate in a $\pi/2$ mode and including:

a graded-$\beta$ capture section at said injection end of said accelerator structure for receiving and accelerating electrons in said one or more streams of electrons;

a $\beta \approx 1$ section exit section at the end of said accelerator structure remote from said capture section for discharging accelerated streams of electrons from said accelerator structure; and an rf coupling section intermediate said capture section and said exit section for coupling rf energy into said accelerator structure;

an rf system including an rf source for converting electrical power to rf power and a transmission conduit for delivering rf power to said coupling section of said accelerator structure;

means disposed at said exit end of said accelerator structure for receiving said one or more streams of electrons and scanning said streams of electrons over a predetermined product area; and control means for controlling said scanning means and synchronously energizing said stream producing means and said rf source during said pulses at said repetition rate.

2. An electron accelerator as defined in claim 1, said beam producing means including a Wehnelt controlled electron gun having:

an anode plate having a central aperture;

a dispenser cathode for emitting electrons; and a Wehnelt focusing-electrode assembly for focusing electrons emitted by the cathode through said aperture of said anode plate and into said capture section of said accelerator;

a resistive heater associated with said cathode for heating said cathode;

means controlled by said control means for energizing said heater during said pulses to cause said cathode to emit electrons during said pulse;

said control means being responsive to a signal representative of the resistance of said heater to cause said means for energizing said heater to deliver only sufficient energy to said heater to maintain the resistance of said heater at a predetermined value.

3. An electron accelerator as defined in claim 2, said electron gun further including:

a housing for axially securing said electron gun to said capture section of said accelerator structure, a first port for connection a gun ion pump, a second port for connection to a getter vacuum pump for maintaining the pressure within said housing and said accelerator structure to a predetermined level;

said control means being further operable to maintain the voltage of said cathode at a first predetermined nominal value between pulses and at a second predetermined value during pulses, and for adjusting the voltage on said Wehnelt focusing-electrode so as to provide an electron beam current of a predetermined magnitude during full power operation.

4. An electron accelerator as defined in claim 1, said rf source being a klystron having:

a collector maintained at ground potential, a cathode maintained at a high, constant negative potential of predetermined magnitude;

a modulated anode maintained at an intermediate voltage while the klystron is conducting current and amplifying the rf pulse;

a first power supply for maintaining the potential of said cathode;

a second, separate programmable power supply for controlling the voltage of the modulated anode, said programmable power supply being responsive to a control signal from said control means to apply a predetermined voltage to said modulated anode; and said control means being operable to determine the operating efficiency of said accelerator and to incrementally change the potential applied to said modulated anode in a first direction when said operating efficiency improves and in the opposite direction when said operating efficiency reduces.

5. An electron accelerator as defined in claim 1, said rf transmission conduit including a microwave window assembly for sealingly separating the interior of said conduit from interior of said accelerator structure while permitting the transfer of rf power from said conduit to said structure, said conduit including a microwave elbow for connecting a coupling cavity of said coupling section with said conduit, said microwave window assembly being positioned within said elbow such that electrons and x-rays originating from within said accelerator structure cannot travel by line-of-sight to said microwave window assembly.

6. An electron accelerator as defined in claim 1, further including means for measuring the electrical current of the electron beam from said accelerator structure, a beam line for transporting said electron beam, a portion of said beam line being connected to but electrically insulated from the balance of said beam line, an axial gap in said beam line portion, a tubular member extending across said gap, said measuring means including a beam current toroid concentrically disposed about said beam line portion, an electrical conductor axially extending between said toroid and said beam line portion and having opposed ends for connection to a pulsed current source, the current flowing through said conductor being representative of the current of said electron beam, said control means being responsive to the magnitude of said beam current to adjust said means for producing said stream of electrons so as to maintain said beam current at a predetermined value.

7. An electron accelerator as defined in claim 6, said beam line portion including an annular flange at each end thereof for connection to similar flanges at adjacent ends of the balance of said beam fine, an electrically insulating gasket interposed between each said flange and its adjacent flange, each said gasket including a pair of gasket elements separated by a radiation resistant polyimide film joined to said gasket elements by a layer of heat-cured glue.

8. An electron accelerator as defined in claim 7, said flanges being Conflat TM flanges.

9. An electron accelerator as defined in claim 6, further including a feedback control system for maintaining said beam line current within predetermined limits, said feedback control system including a pulse generator for generating reference current pulses synchronized and coincident with beam current pulses to be measured, said reference pulses being of the opposite polarity to that of said beam line current so that the current in the first mentioned conductor is the differential between the beam line current and the current of said reference pulses, said control system outputting a control signal to said pulse generator tending to reduce said differential to zero.

10. An electron linear accelerator for use in industrial material processing comprising:

an elongated, L-band, resonant, electron accelerator structure defining a linear electron flow path and having an electron injection end and an electron exit end, means at said injection end for producing and delivering one or more streams of electrons to said electron injection end of said accelerator structure during pulses of predetermined duration and of predetermined repetition rate, said accelerator structure being comprised of a plurality of axially coupled microwave cavities constructed to resonate in a $\pi/2$ mode and including:

a graded-$\beta$ capture section at said injection end of said accelerator structure for receiving and accelerating electrons in said one or more streams of electrons;

a $\beta \approx 1$ section exit section at the end of said accelerator structure remote from said capture section for discharging accelerated streams of electrons from said accelerator structure; and an rf coupling section intermediate said capture section and said exit section for coupling rf energy into said accelerator structure;

an rf system including an rf source for converting electrical power to rf power and a transmission conduit for delivering rf power to said coupling section of said accelerator structure, said rf source being a klystron having:

a collector maintained at ground potential, a cathode maintained at a high, constant negative potential of predetermined magnitude;

a modulated anode maintained at an intermediate voltage while the klystron is conducting current and amplifying the rf pulse;

a first power supply for maintaining the potential of said cathode; and a second, separate programmable power supply for controlling the voltage of the modulated anode, said programmable power supply being responsive to a control signal from said control means to apply a predetermined voltage to said modulated anode;

said control means being operable to determine the operating efficiency of said accelerator and to incrementally change the potential applied to said modulated anode in a first direction when said operating efficiency improves and in the opposite direction when said operating efficiency deteriorates;

said rf transmission conduit including a microwave window assembly for sealingly separating the interior of said conduit ,from interior of said accelerator structure while permitting the transfer of rf power from said conduit to said accelerator structure, said conduit including a microwave elbow for connecting a coupling cavity of said coupling section with said conduit, said microwave window assembly being positioned within said elbow such that electrons and x-rays originating from within said accelerator structure cannot travel by line-of-sight to said microwave window assembly;

means disposed at said exit end of said accelerator structure for receiving said one or more streams of electrons and scanning said streams of electrons over a predetermined product area;

control means for controlling said scanning means and synchronously energizing said stream producing means and said rf source during said pulses at said repetition rate;

said stream producing means including a Wehnelt controlled electron gun having:

an anode plate having a central aperture;

a dispenser cathode for emitting electrons;

a Wehnelt focusing-electrode assembly for focusing electrons emitted by the cathode through said aperture of said anode plate and into said capture section of said accelerator;

a resistive heater associated with said cathode for heating said cathode; and means controlled by said control means for energizing said heater during said pulses to cause said cathode to emit electrons during said pulse;

said control means being responsive to a signal representative of the resistance of said heater to cause said means for energizing said heater to deliver only sufficient energy to said heater to maintain the resistance of said heater at a predetermined value;

a housing for axially securing said electron gun to said capture section of said accelerator structure, a first port for connection to a gun ion pump, a second port for connection to a getter vacuum pump for maintaining the pressure within said housing and said accelerator structure to a predetermined level;

said control means being further operable to maintain the voltage of said cathode at a first predetermined nominal value between pulses and at a second predetermined value during pulses, and for adjusting the voltage on said Wehnelt focusing-electrode so as to provide an electron beam current of a predetermined magnitude during full power operation;

further including means for measuring the electrical current of the electron beam from said accelerator structure a beam line for transporting said electron beam, a portion of said beam line being connected to but electrically insulated from the balance of said beam line, an axial gap in said beam line portion, a tubular member extending across said gap, said measuring means including a beam current toroid concentrically disposed about said beam line portion, an electrical conductor axially extending between said toroid and said beam line portion and having opposed ends for connection to a pulsed current source, the current flowing through said conductor being representative of the current of said electron beam, said control means being responsive to the magnitude of said beam current to adjust said means for producing said stream of electrons so as to maintain said beam current at a predetermined value, said beam line portion including an annular flange at each end thereof for connection to similar flanges at adjacent ends of the balance of said beam line, an electrically insulating gasket interposed between each said flange and its adjacent flange, each said gasket including a pair of gasket elements separated by a radiation resistant polyimide film joined to said gasket elements by a layer of heat-cured glue; and a feedback control system for maintaining said beam line current within predetermined limits, said feedback control system including a pulse generator for generating reference current pulses synchronized and coincident with beam current pulses to be measured, said reference pulses being of the opposite polarity to that of said beam line current so that the current in the first mentioned conductor is the differential between the beam line current and the current of said reference pulses, said control system outputting a control signal to said pulse generator tending to reduce said differential to zero.

* * * * *